(12) United States Patent
Kanamori

(10) Patent No.: US 6,787,430 B2
(45) Date of Patent: Sep. 7, 2004

(54) SEMICONDUCTOR DEVICE AND METHOD FOR MANUFACTURING SEMICONDUCTOR DEVICE

(75) Inventor: Jun Kanamori, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/347,705

(22) Filed: Jan. 22, 2003

(65) Prior Publication Data

US 2003/0132475 A1 Jul. 17, 2003

Related U.S. Application Data

(62) Division of application No. 09/525,110, filed on Mar. 14, 2000, now Pat. No. 6,538,282.

(51) Int. Cl.[7] .............................................. H01L 21/20
(52) U.S. Cl. ...................... 438/393; 438/149; 438/155; 438/239; 438/250; 438/252; 438/395
(58) Field of Search ................................ 438/239, 250, 438/251, 252, 393, 394, 395, 155, 162, 165, 149

(56) References Cited

U.S. PATENT DOCUMENTS

| | | | | |
|---|---|---|---|---|
| 4,571,816 A | * | 2/1986 | Dingwall | ..................... 438/251 |
| 5,250,456 A | | 10/1993 | Bryant | |
| 5,429,981 A | * | 7/1995 | Gardner et al. | ............. 438/394 |
| 5,888,854 A | * | 3/1999 | Morihara | ..................... 438/155 |
| 6,074,907 A | * | 6/2000 | Oh et al. | ..................... 438/239 |
| 6,090,657 A | * | 7/2000 | Yamoto et al. | ............. 438/240 |
| 6,096,584 A | * | 8/2000 | Ellis-Monaghan et al. | .. 438/151 |
| 6,160,269 A | | 12/2000 | Takemura et al. | |
| 6,258,650 B1 | * | 7/2001 | Sunouchi | ..................... 438/238 |
| 6,287,900 B1 | * | 9/2001 | Yamazaki et al. | ........... 438/151 |

FOREIGN PATENT DOCUMENTS

| | | |
|---|---|---|
| JP | 8-167698 | 6/1996 |
| JP | 6-13573 | 1/1998 |

* cited by examiner

Primary Examiner—Bradley Baumeister
Assistant Examiner—N. Drew Richards
(74) Attorney, Agent, or Firm—Volentine Francos, PLLC

(57) ABSTRACT

In a semiconductor device and method of manufacturing thereof, a semiconductor device having an SOI structure is provided with a capacitor including a first electrode in an SOI layer, a second electrode opposing the first electrode, and a dielectric film therebetween. An isolation region is provided as contained in the SOI layer to electrically isolate the first electrode from remaining areas of the SOI layer, such as active areas or the like. The method includes forming the isolation regions in the SOI layer, forming the first electrode in the SOI layer as electrically isolated from the remaining areas of the SOI layer by the isolation regions, forming the dielectric film on the first electrode, and forming the second electrode on the dielectric film opposite the first electrode.

17 Claims, 17 Drawing Sheets

S9

S1

S2

S3

S4

S5

S6

S7

S8

S9

S11

S12

S13

S14

S15

S16

S17

S20

SEMICONDUCTOR DEVICE AND METHOD FOR MANUFACTURING SEMICONDUCTOR DEVICE

CROSS REFERENCE TO RELATED APPLICATIONS

This is a divisional application of application Ser. No. 09/525,110, filed Mar. 14, 2000, now U.S. Pat. No. 6,538,282 which is hereby incorporated by reference in its entirety for all purposes.

BACKGROUND OF THE INVENTION

The present invention relates to a semiconductor device, and more specifically, a semiconductor device adopting an SOI (silicon on insulator) structure, which is provided with a capacitor. And the present invention also relates to a method for manufacturing a semiconductor device.

In pace with the great progress achieved in the technical field of semiconductor devices over the years, the need for bringing system LSIs into practical use, achieved by mounting digital circuits and analog circuit together on a single chip has been realized in recent years. In such a system LSI device, it is necessary to create a capacitor structure achieved by overlaying conductive films (e.g., polysilicon, aluminum) with thin oxide films sandwiched in between on a single chip, in addition to a gate structure.

Furthermore, a device having an LSI formed on an SOI wafer mainly in order to achieve a reduction in power consumption and higher speed in the device has been attracting much interest recently. It is to be noted that an SOI wafer refers to a wafer constituted by forming an insulating layer on a substrate and forming a thin silicon layer (SOI layer) on the insulating layer.

A semiconductor device 800 achieving an SOI structure is manufactured through the following manufacturing flow in the prior art.

As illustrated in FIG. 10(a), a pad film 820 is first formed on an SOI layer 808 of an SOI wafer 802, and then an oxidation-preventing film 822 is formed over the pad film 820. Next, as illustrated in FIG. 10(b), the pad film 820 and the oxidation-preventing film 822 are patterned. When the patterning process is completed, the pad film 820 and the oxidation-preventing film 822 are left only over anticipated formation areas 812', where transistors 812 are to be formed, and they are no longer present over anticipated formation area 810', in which capacitor 810 is to be formed. Next, as illustrated in FIG. 10(c), a field oxidation is performed by using the patterned oxidation-preventing film 822 as a mask to form isolation regions 814 at the SOI layer 808. In the semiconductor device 800, an isolation region 814 is also formed over the anticipated formation area 810'. Next, as illustrated in FIG. 10(d), a first electrode 810a (120~200 nm) constituted of conductive polysilicon is formed on the SOI layer 808 located at the anticipated formation area 810', and then, the surface of the first electrode 810a is oxidized to form a dielectric film 810b (8~10 nm) to achieve a required capacitance at the capacitor 810. Next, the oxidation-preventing film 822 and the pad film 820 at the anticipated formation areas 812' are removed. It is to be noted that a suitable photoresist pattern is used to protect the anticipated formation area 810' to ensure that the dielectric film 810b is not removed during this process. Then, as illustrated in FIG. 10(e), after performing implantation processing that is necessary to form the transistors 812 in active areas 812a, the active areas 812a undergo gate oxidation and a gate insulating film 812b is formed at the active areas 812a. Next, as illustrated in FIG. 10(f), a conductive polysilicon film 826 (120~200 nm) is formed over the entire surface of the wafer. Then, as illustrated in FIG. 10(g), by patterning the polysilicon film 826, gate electrodes 812c of the transistors 812 and a second electrode 810c of the capacitor 810 are formed out of the polysilicon film 826.

However, in the semiconductor device 800 and the manufacturing method thereof in the prior art described above, the first electrode 810a of the capacitor 810 is formed on the SOI layer 808. As a result, a stage 810a' corresponding to the thickness of the first electrode 810a is formed at the wafer surface when forming the second electrode 810c of the capacitor 810 and the gate electrodes 812c of the transistors 812. This stage 810a' causes degradation in the pattern accuracy during the photolithography process implemented to form the second electrode 810c and the gate electrodes 812c. Since extremely fine control is required for the gate electrode processing accuracy in a method for manufacturing a semiconductor device in the future, the presence of the stage 810a' may prove fatal to the semiconductor device.

It is to be noted that while it is conceivable to form the second electrode of the capacitor and the gate electrodes at the transistors through separate steps, this solution presents a new problem in that the manufacturing process becomes lengthy.

The present invention has been completed by addressing the problems of the semiconductor device and the manufacturing method thereof in the prior art, including the problems discussed above.

SUMMARY OF THE INVENTION

Accordingly, the semiconductor device assuming an SOI structure according to the present invention employs a structure having a capacitor provided with a dielectric member, a first electrode contained in an SOI layer and a second electrode facing opposite the first electrode via the dielectric member, and an isolation region that is contained in the SOI layer and electrically isolates the first electrode from the remaining area of the SOI layer. In the semiconductor device employing this structure, the first electrode is contained in the SOI layer. Thus, when forming electrodes and wirings for electrical elements (e.g., transister) excluding the capacitor on the SOI layer, the electrodes and the wirings can be formed on a surface that is essentially the same as the surface on which the second electrode is formed. As a result, the pattern for the electrodes and the wirings can be formed concurrently with the formation of the pattern for the second electrode with a high degree of accuracy.

It is to be noted that according to the present invention, the first electrode of the capacitor may be constituted of silicon doped with a specific impurity or polysilicon doped with a specific impurity, for instance. Alternatively, according to the present invention, the first electrode may be constituted of a metal silicide, such as Co (cobalt) silicide, Ti (titanium) silicide or Mo (molybdenum) silicide.

In addition, according to the present invention, the dielectric member at the capacitor may be constituted of, for instance, silicon oxide.

Furthermore, according to the present invention, the second electrode of the capacitor may be constituted of, for instance, polysilicon doped with a specific impurity. Alternatively, the second electrode may be constituted of a material whose main constituent is a metal such as an Al (aluminum) alloy, W (tungsten) or Cu (copper).

According to the present invention, the second electrode may be formed through, for instance, a combination of photolithography and etching or through the CMP method.

Moreover, according to the present invention, the SOI layer may be either the full depletion type or the partial depletion type. It is to be noted that normally, the threshold voltage can be set lower at a full depletion type SOI layer than the threshold voltage of a partial division type SOI layer which would be set at the same leak current area.

In addition, addressing the problems discussed above, the method for manufacturing a semiconductor device assuming an SOI structure and provided with a capacitor constituted of a first electrode, a dielectric member and a second electrode according to the present invention comprises a first step in which an isolation region to be contained in the SOI layer is formed, a second step in which the first electrode is formed, contained in the SOI layer and electrically isolated from the remaining area of the SOI layer, a third step in which the dielectric member is formed on the first electrode and a fourth step in which the second electrode is formed on the dielectric member facing opposite the first electrode via the dielectric member.

It is to be noted that in the first step, the isolation region may be formed through the LOCOS method.

In addition, a process in which required conductivity is achieved at the SOI layer where the capacitor is to be formed through ion implantation of a specific impurity may be included in the second step.

The second step may otherwise include a process in which the anticipated capacitor formation area at the SOI layer is transformed to polysilicon through ion implantation of an inert element and a process in which required conductivity is achieved at the SOI layer corresponding to the polysilicon anticipated formation area through ion implantation of a specific impurity.

Alternatively, the second step may include a process in which a metal film is formed on the SOI layer over the area where the capacitor is to be formed and a process in which the SOI layer corresponding to the anticipated formation area is reacted with the metal film through a heat treatment to form silicide.

As a further alternative, a step may be included in which a layer insulating film is formed having a pattern that opens over the area where the capacitor is to be formed, to be implemented before the fourth step, and a process in which a metal layer that covers, at least, the anticipated formation area is formed and a process in which the second electrode is formed at the anticipated formation area out of the metal layer through photolithography and etching may be included in the fourth step.

Furthermore, a step may be included in which a layer insulating film is formed having a pattern that opens over the area where the capacitor is to be formed, to be implemented before the fourth step, and a process in which a metal layer that covers, at least, the anticipated formation area and a specific portion of the layer insulating film is formed and a process in which the second electrode is formed at the anticipated formation area and a specific wiring is formed at the specific area out of the metal layer through photolithography and etching may be included in the fourth step.

Moreover, a step may be included in which a layer insulating film is formed having a pattern that opens over the area where the capacitor is to be formed, to be implemented before the fourth step, and a process in which a metal layer that covers, at least, the anticipated formation area is formed and a process in which the second electrode is formed at the anticipated formation area out of the metal layer through CMP may be included in the fourth step.

Alternatively, a step in which a transistor having an active area that is contained in the SOI layer is formed and a step in which a silicon block is formed at the surface of the SOI layer that corresponds to, at least, the upper portion of the active area may be included to be implemented after the second step.

Moreover, a step in which a transistor having an active area that is contained in the SOI layer is formed, a step in which a silicon block is formed at the surface of the SOI layer that corresponds to, at least, the upper portion of the active area and a step in which the silicon block is reacted to form silicide may be included to be implemented after the second step.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF PREFERRED EMBODIMENTS

The following is a detailed explanation of the preferred embodiments of the present invention given in reference to the attached drawings. It is to be noted that in the following explanation and the attached drawings, the same reference numbers are assigned to components achieving identical functions and structural features to preclude the necessity for repeated explanation thereof.

(First Embodiment)

Figure 1A:
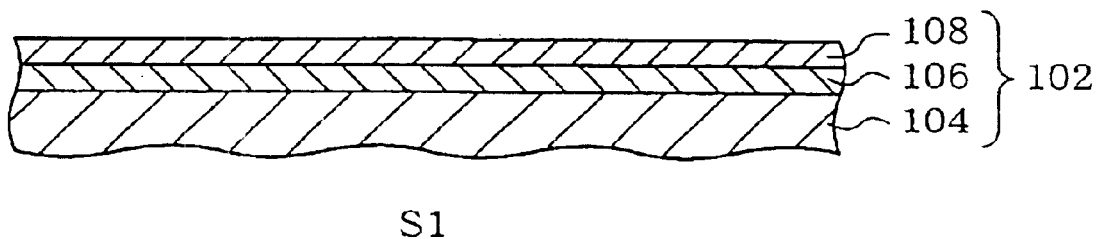
FIGS. 1(a)~1(i) illustrate steps in a method for manufacturing a semiconductor device that may employ the present invention.
Figure 1B:
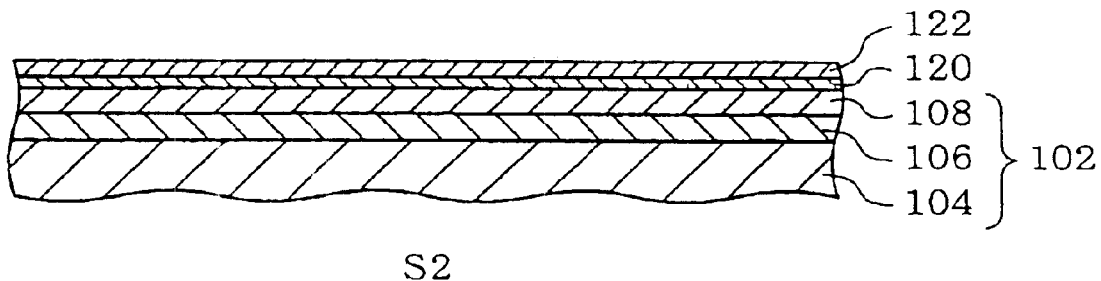
Figure 1C:
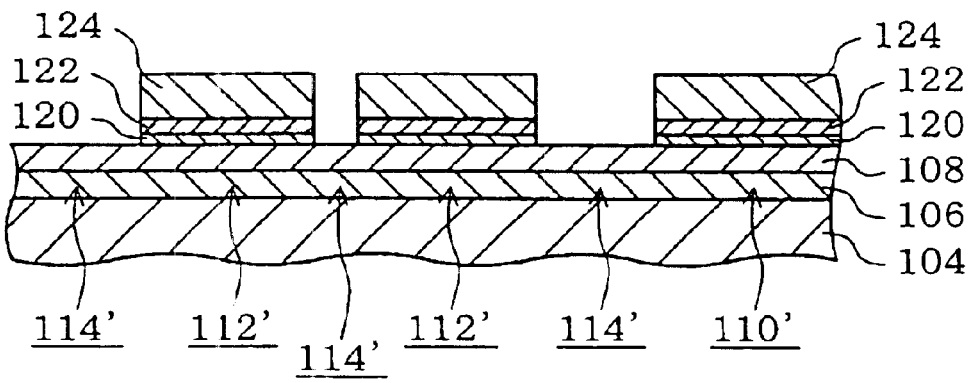
Figure 1D:
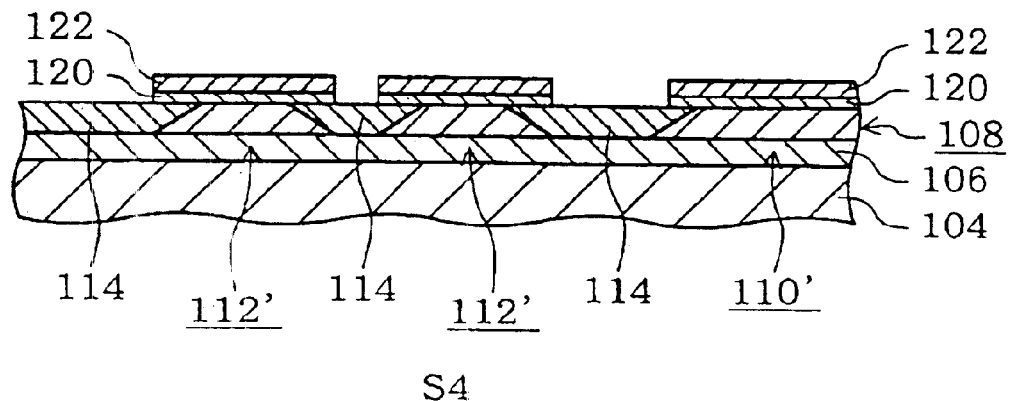
Figure 1E:
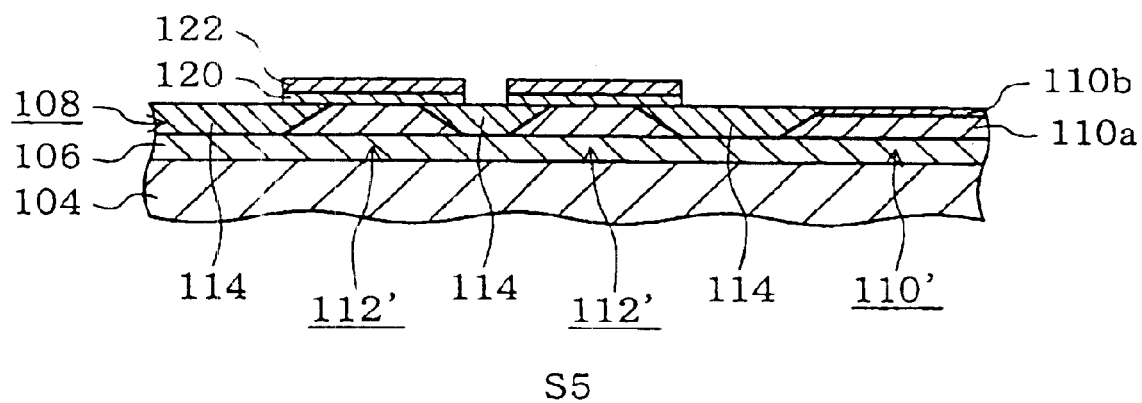
Figure 1F:
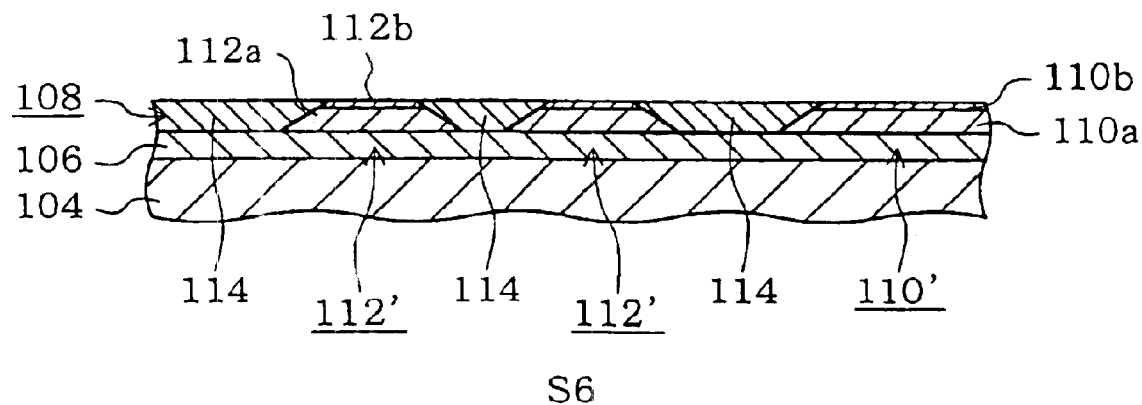
Figure 1G:
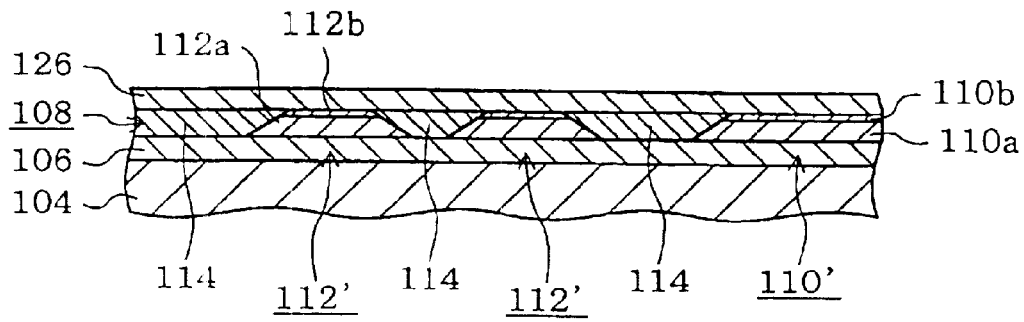
Figure 1H:
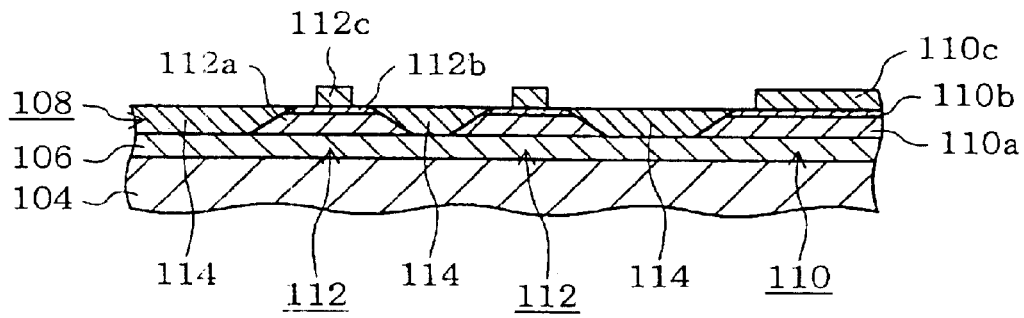
Figure 1I:
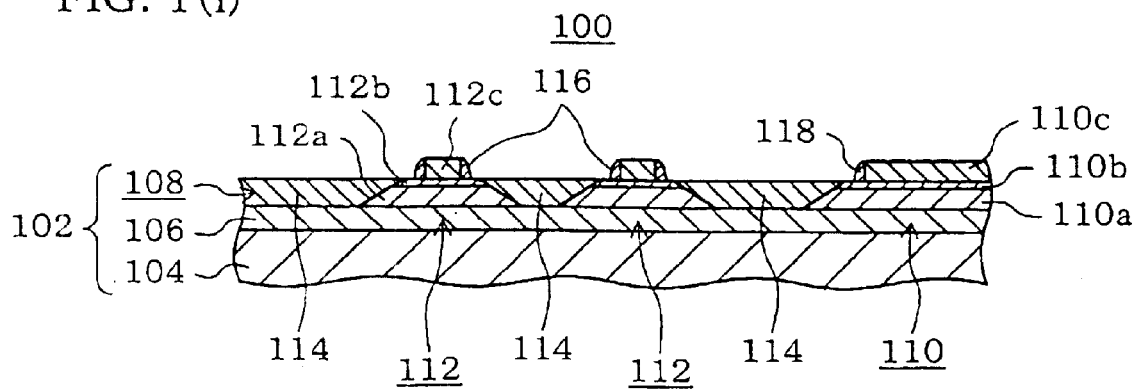

The first embodiment is explained in reference to FIGS. 1(a)~1(i). It is to be noted that FIGS. 1(a)~1(i) illustrate steps taken in a method for manufacturing a semiconductor device 100 in this embodiment. FIG. 1(i) also illustrates the essential structure of the semiconductor device 100.

As illustrated in FIG. 1(i), the semiconductor device 100 assumes an 501 structure and may be employed in, for instance, a RF (radio frequency) circuit, a HF (high frequency) circuit or an analog circuit. An SOI wafer 102 of the semiconductor device 100 comprises a substrate 104, an insulating layer 106 and SOI layer 108. On the SOI wafer 102, one or a plurality of capacitors 110 and one or a plurality of transistors 112, at least, are mounted together. In the embodiment, the substrate 104 may be a silicon substrate, and the insulating layer 106 may be constituted of, for instance, a BOX layer (buried oxide layer).

Each capacitor 110 is provided with a first electrode 110a that is contained in the SOI layer 108, a dielectric film 110b contained in the SOI layer 108 and a second electrode 110c formed on the SOI layer 108. This capacitor 110 is a POS (polysilicon-oxide-semiconductor) type capacitor. In the embodiment, the first electrode 110a may be constituted of silicon doped with a specific impurity, the dielectric film 110b may be constituted of silicon oxide and the second electrode 110c may be constituted of polysilicon doped with a specific impurity.

Each transistor 112 is provided with an active area 112a that is contained in the SOI layer 108, a gate insulating film 112b contained in the SOI layer 108 and a gate electrode 112c formed on the SOI layer 108. In the embodiment, the active area 112a may be constituted of, for instance, silicon doped with a specific impurity, the gate insulating film 112b may be constituted of, for instance, silicon oxide and the gate electrode 112c may be constituted of, for instance, polysilicon doped with a specific impurity.

In addition, the semiconductor device 100 is provided with isolation regions 114 contained in the SOI layer 108. The isolation regions 114 each electrically isolate, at least, a first electrode 110a from other area contained in the SOI layer 108. The area excluding the first electrode 110a contained in the SOI layer 108 include active areas 112a and another first electrode 110a. It is to be noted that in the embodiment, the isolation regions 114 may assume a structure that also achieves electrical isolation of each of the active areas 112a from other area contained in the SOI layer 108.

In the embodiment, the isolation regions 114 may be constituted of, for instance, a field oxide film. Such isolation regions 114 may be formed through, for instance, the LOCOS method.

It is to be noted that in FIG. 1(i), reference numbers 116 and 118 each indicate a side wall. The side walls 116 are used as spacers when achieving an LDD structure at the transistors 112. In addition, the side walls 116 and 118 may be required particularly in a structure in which a layer insulating film is formed on the SOI layer 108. In the semiconductor device 100, the side walls 116 and 118 may be constituted of, for instance, silicon oxide.

The semiconductor device 100 having the essential structure explained above may be manufactured through steps S1~S9, which correspond to FIGS. 1(a)~1(i) respectively. Steps S1~S9 are implemented sequentially in this order. It is to be noted that the method for manufacturing the semiconductor device according to the present invention may include various steps excluding steps S1~S9.

As shown in FIG. 1(a), the SOI wafer 102 is formed in step S1.

The SOI wafer 102 may be formed through, for instance, SIMOX (separation by implanted oxygen)method. It is to be noted that the SOI wafer 102 in the semiconductor device may be either a high-dose wafer or a low dose wafer. In addition, the SOI wafer 102 may be formed by pasting together an Si substrate having an insulating layer 106 formed therein and an Si substrate without a insulating layer 106, instead.

As shown in FIG. 1(b), a pad film 120 is formed on the SOI layer 108 and an oxidation-preventing film 122 is formed on the pad film 120 in step S2. The pad film 120, which is provided to isolate the oxidation-preventing film 122 from the SOI layer 108, may be constituted of, for instance, silicon oxide. In addition, the oxidation-preventing film 122, which is provided to prevent oxidation of the covered areas, may be constituted of, for instance, silicon nitride.

As shown in FIG. 1(c) a laminated film constituted of the pad film 120 and the oxidation-preventing film 122 is patterned through photolithography and etching in step S3. In step S3, the pad film 120 and the oxidation-preventing film 122 are removed from anticipated formation areas 114' where the isolation regions 114 are to be formed, and are left intact in an anticipated formation area 110' where each capacitor 110 is to be formed and anticipated formation areas 112' where the transistors 112 are to be formed. It is to be noted that in FIG. 1(c), reference number 124 indicates a photoresist.

As shown in FIG. 1(d), in step S4, the photoresist 124 is first removed and then the isolation regions 114 are formed. In step S4, the photoresist 124 may be removed through, for instance, an oxygen plasma treatment and a hydrogen peroxide sulfate treatment. In addition, the isolation regions 114 may be formed by oxidizing a wafer at which the pattern of the oxidation-preventing film 122 remains.

It is to be noted that the type of oxidation treatment explained before is normally referred to as field oxidation.

As shown in FIG. 1(e), the first electrode 110a and the dielectric film 110b are formed in step S5. More specifically, step S5 is implemented through the following procedure.

First, a specific photoresist pattern (not shown) is formed to ensure that the oxidation-preventing film 122 and the pad film 120 over the anticipated formation areas 112' are not removed. Next, the oxidation-preventing film 122 and the pad film 120 on the anticipated formation area 110' are removed to expose the SOI layer 108 in the area 110'. Then, the first electrode 110a achieving the required conductivity is formed at the SOI layer 108 over the anticipated formation area 110' by introducing a specific impurity through, for instance, ion implantation. Next, by oxidizing the surface of the first electrode 110a at the SOI layer 108, for instance, the dielectric film 110b is formed.

It is to be noted that in step S6 in FIG. 1(f), the surface of the SOI layer 108 at the anticipated formation area 110' is oxidized again while the surface of the SOI layer 108 at the anticipated formation areas 112' is oxidized. For this reason, when forming the dielectric film 110b in step 5, its thickness should be ideally set at a small value in view of this re-oxidation.

As shown in FIG. 1(f), the active areas 112a and the gate insulating film 112b are formed in step S6. More specifically, step S6 is implemented through the following procedure.

First, the SOI layer 108 at the anticipated formation areas 112' is exposed by removing the oxidation-preventing film 122 and the pad film 120 from the anticipated formation areas 112'. Next, the active areas 112a achieving the required conductivity are formed at the SOI layer 108 over the anticipated formation areas 112' by introducing a specific impurity through, for instance, ion implantation. Then, by oxidizing the surfaces of the active areas 112a at the SOI layer 108, for instance, the gate insulating film 112b is formed. It is to be noted that the surface of the wafer achieves a near flat state when this step S6 is completed.

As illustrated in FIG. 1(g), a polysilicon film 126 is formed over the entire surface of the SOI layer 108 through, for instance, the CVD (chemical vapor deposition) method.

In the method for manufacturing the semiconductor device in this embodiment, the surface of the wafer achieves a near flat state when step S6 is completed, as explained above. As a result, a polysilicon film 126 having an almost flat surface can be formed in step S7.

As shown in FIG. 1(*h*), the second electrode 110*c* and the gate electrodes 112*c* are formed out of the polysilicon film 126 in step S8. The second electrode 110*c* and the gate electrodes 112*c* can be formed at the same time by first patterning the polysilicon film 126 through photolithography and etching and then introducing a specific impurity through, for instance, ion implantation to achieve the required conductivity in the patterned polysilicon film. Since the polysilicon film 126 having an almost flat surface is formed in step S7, as described earlier in the method for manufacturing the semiconductor device in the embodiment, the photolithography process in step S8 can be implemented with a high degree of accuracy.

As shown in FIG. 1(*i*), the side walls 116 and 118 are formed in step S9. The side walls 116 and 118 may be formed by, for instance, covering the entire surface of the wafer with a silicon oxide film through the CVD method and then etching back the silicon oxide film over the entire surface.

It is to be noted that in the method for manufacturing the semiconductor device in the embodiment described above, the thickness of the insulating layer 106 may be set at, for instance, 100 nm~200 nm, the thickness of the SOI layer 108 may be set at, for instance, 50 nm~80 nm, the thickness of the pad film 120 may be set at, for instance, 6 nm~10 nm, the thickness of the oxidation-preventing film 122 may be set at, for instance, 40 nm~70 nm, and the thickness of the polysilicon film 126 may be set at, for instance, 120 nm~200 nm. In addition, the thickness of the dielectric film 110*b* may be set within a range of, for instance, 8 nm~10 nm, with the thickness of the gate insulating film 112*b* set at, for instance, 3 nm~7 nm.

As explained above, the first electrode of the capacitor is formed within the SOI layer in the embodiment. Consequently, during the formation of the second electrode at the capacitor and the gate electrodes at the transistors, no stage is formed at the wafer surface. As a result, highly accurate patterning is achieved when forming the second electrode and the gate electrodes at the same time through photolithography and etching.

(Second Embodiment)

Figure 2:
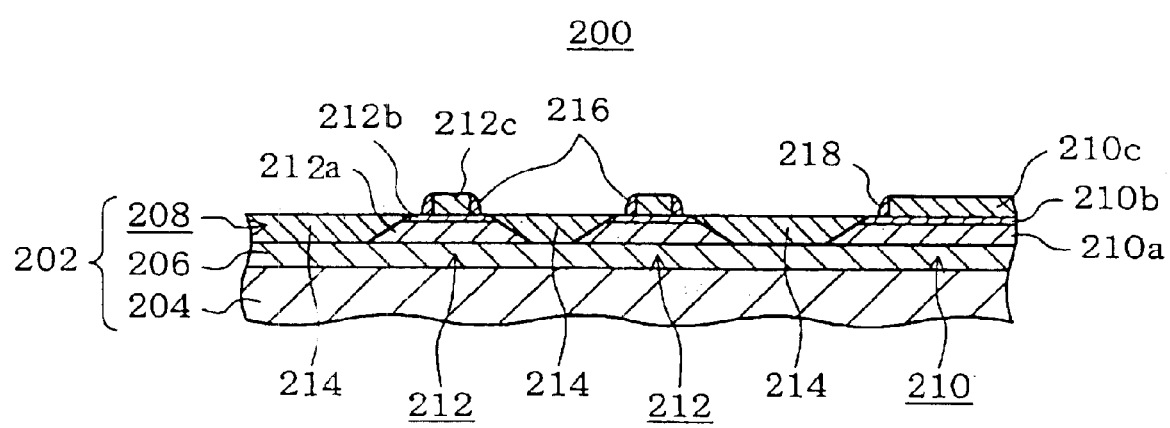
FIG. 2 illustrates the essential structure of another semiconductor device that may employ the present invention.
Figure 3A:
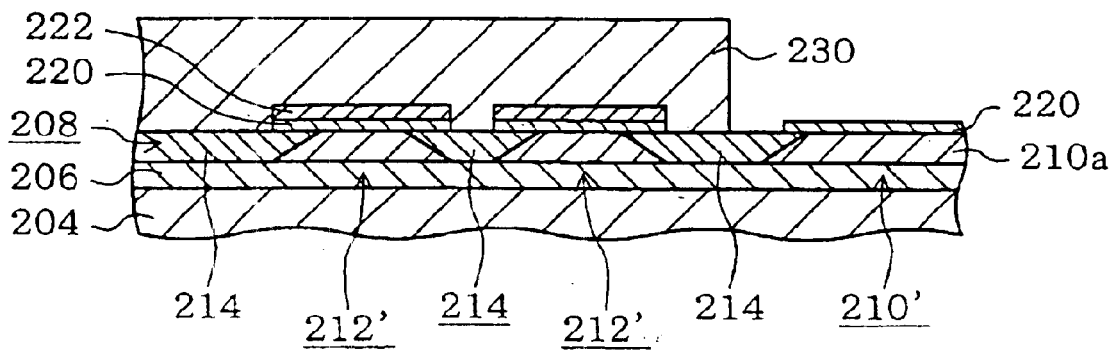
FIGS. 3(a)~3(c) illustrate steps taken in a method for manufacturing a semiconductor device shown in FIG. 2.
Figure 3B:
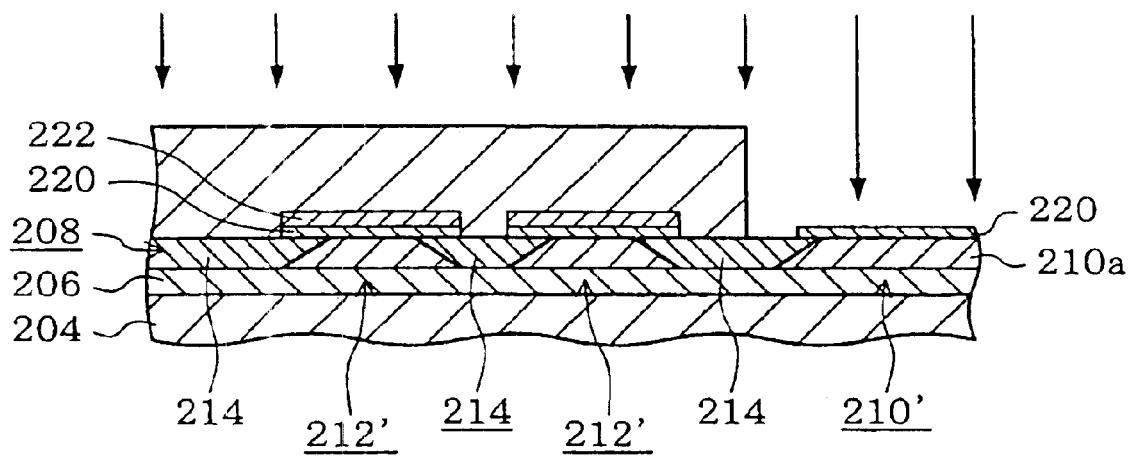
Figure 3C:
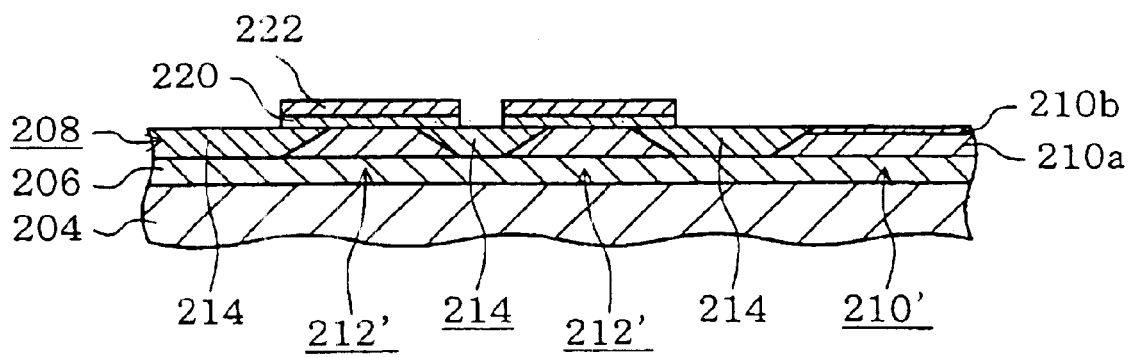

The second embodiment is now explained in reference to FIG. 2 and FIGS. 3(*a*)~3(*c*). It is to be noted that FIG. 2 illustrates the essential structure of a semiconductor device 200 in the second embodiment. FIGS. 3(*a*)~3(*c*) illustrate steps taken in a method for manufacturing the semiconductor device 200.

As illustrated in FIG. 2, the semiconductor device 200 differs from the semiconductor device 100 in the first embodiment shown in FIG. 1(*i*) in the structure of the first electrode at the capacitor. The other structural features of the semiconductor device 200 are essentially identical to those of the semiconductor device 100 in FIG. 1(*i*).

In the semiconductor device 200, a first electrode 210*a* is constituted of polysilicon doped with a specific impurity. As a result, a capacitance that is different from the capacitance in the capacitor 110 in FIG. 1(*i*) can be achieved with ease for the capacitor 210.

The semiconductor device 200 in the embodiment can be manufactured through a manufacturing flow that is essentially identical to the flow of the manufacturing method for manufacturing the semiconductor device 100 illustrated in FIGS. 1(*a*)~1(*i*) by substantially modifying step S5 in FIG. 1(*e*). Hereafter, the modified step S5 is to be referred to as step S52.

As shown in FIG. 3(*a*), in step S52, first, a photoresist 230 is formed at the wafer surface having undergone step S4 (see FIG. 1(*d*)), and then an oxidation-preventing film 222 over an anticipated formation area 210' where the capacitor 210 is to be formed is removed. The photoresist 230 formed in step S52 has a pattern that opens at the anticipated formation area 210' and is formed through, for instance, photolithography. In addition, the oxidation-preventing film 222 over the anticipated formation area 210' is removed through an etching process during which the photoresist 230 is used as a mask.

Next, as shown in FIG. 3(*b*), an SOI layer 208 over the anticipated formation area 210' is reacted to form polysilicon and then the first electrode 210*a* is formed by achieving the required conductivity in the polysilicon area 210' in step S52.

The anticipated formation area 210' may be reacted to form polysilicon by implanting ions of a specific element via a pad film 220. The specific element that is used in this process should be, ideally, an inert element such as Ar (argon). It is to be noted that when using Ar for the reaction to form polysilicon in the anticipated formation area 210', the ion implantation maybe implemented over the entire wafer surface at a dose of approximately $4.0e^{14}$.

In addition, conductivity can be achieved at the polysilicon anticipated formation area 210' by, for instance, introducing a specific impurity such as P (phosphorus) through ion implantation.

In step S52, the pad film 220 on the anticipated formation area 210' is removed, then the photoresist 230 is removed and a dielectric film 210*b* is formed at the surface of the first electrode 210*a* through an oxidation treatment, as illustrated in FIG. 3(*c*).

It is to be noted that in FIG. 2 and FIGS. 3(*a*)~3(*c*), reference number 202 indicates an SOI wafer, reference number 204 indicates a substrate, reference number 206 indicates an insulating layer and reference number 210*c* indicates a second electrode of the capacitor 210. In addition, reference number 212*a* indicates an active area at a transistor 212, reference number 212*b* indicates a gate insulating film at the transistor 212 and reference number 212*c* indicates a gate electrode of the transistor 212. Reference number 214 indicates an isolation region, with reference numbers 216 and 218 indicating side walls.

As explained above, the first electrode of the capacitor is formed within the SOI layer in the embodiment. Consequently, during the formation of the second electrode at the capacitor and the gate electrodes at the transistors, no stage is formed at the wafer surface. As a result, highly accurate patterning is achieved when forming the second electrode and the gate electrodes at the same time through photolithography and etching.

In addition, the capacitor in the embodiment is a PIP (polysilicon-insulator-polysilicon) capacitor. Consequently, a capacitance that is different from the capacitance in the first embodiment can easily be achieved in the capacitor in this embodiment.

(Third Embodiment)

Figure 4:
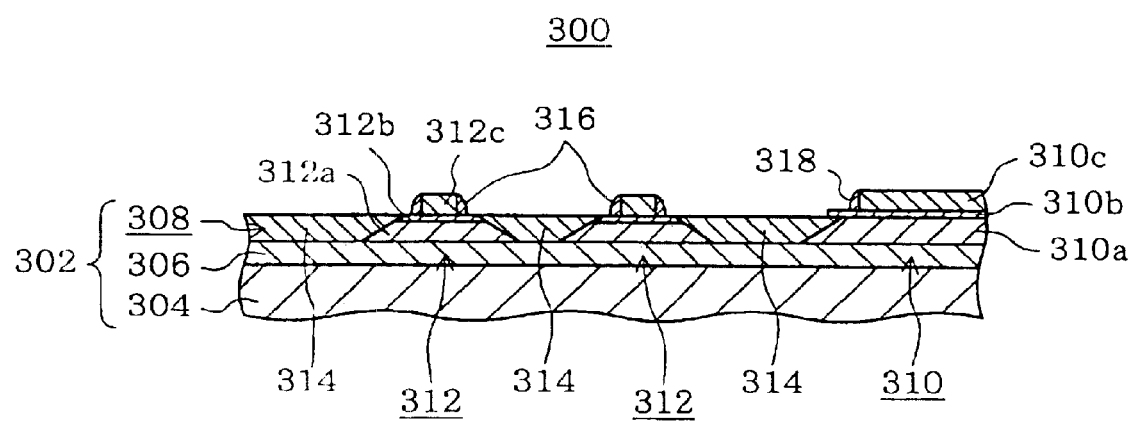
FIG. 4 illustrates the essential structure of another semiconductor device that may employ the present invention.

The third embodiment is now explained in reference to FIG. 4 and FIGS. 5(*a*)~5(*d*). It is to be noted that FIG. 4 illustrates the essential structure of a semiconductor device 300 in the third embodiment. FIGS. 5(*a*)~5(*d*) illustrate steps taken in a method for manufacturing the semiconductor device 300.

As illustrated in FIG. 4, the semiconductor device 300 differs from the semiconductor device 100 in the first embodiment shown in FIG. 1(i) in the structure of the first electrode and the dielectric film at its capacitor. The other structural features of the semiconductor device 300 are essentially identical to those of the semiconductor device 100 in FIG. 1(i).

In the semiconductor device 300, a first electrode 310a is constituted of a metal silicide. Thus, a capacitance that is different from the capacitance at the capacitor 110 in FIG. 1(i) can be achieved at a capacitor 310 with ease. It is to be noted that the first electrode 310a may be constituted of any metal silicide selected from a group comprising: Co silicide, Ti silicide and Mo silicide, for instance.

In the semiconductor device 300, a dielectric film 310b is formed on an SOI layer 308 unlike the dielectric film 110b in FIG. 1(i). This dielectric film 310b may be constituted of, for instance, silicon oxide.

The semiconductor device 300 in the embodiment can be manufactured through a manufacturing flow that is essentially identical to the flow of the manufacturing method for manufacturing the semiconductor device 100 illustrated in FIGS. 1(a)~1(i) by substantially modifying step S5 in FIG. 1(e). Hereafter, the modified step S5 is to be referred to as step S53.

Figure 5A:
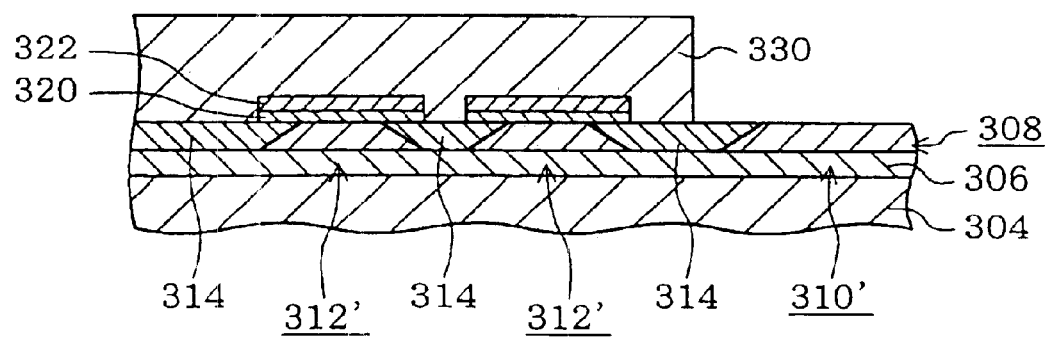
FIGS. 5(a)~5(d) illustrate steps taken in a method for manufacturing the semiconductor device shown in FIG. 4.

As shown in FIG. 5(a), in step S53, first, a photoresist 330 is formed at the wafer surface having undergone step S4 (see FIG. 1(d)), and then an oxidation-preventing film 322 and a pad film 320 over an anticipated formation area 310' where the capacitor 310 is to be formed, are removed. The photoresist 330 formed in step S53 has a pattern that opens at the anticipated formation area 310' and is formed through, for instance, photolithography. In addition, the oxidation-preventing film 322 and the pad film 320 over the anticipated formation area 310' is removed through an etching process during which the photoresist 330 is used as a mask.

Figure 5B:
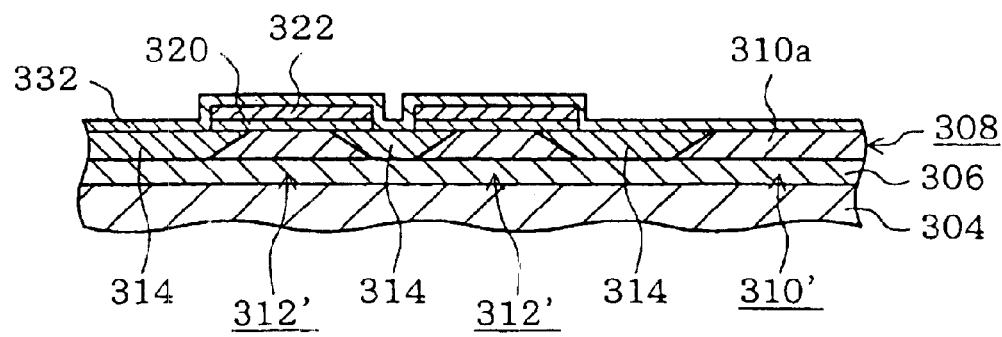

In step S53, the photoresist 330 is next removed, then a metal film 332 is formed over the entire wafer surface and a specific type of annealing treatment is implemented on the wafer, as shown in FIG. 5(b). Since the SOI layer 308 and the metal film 332 come into direct contact with each other at the anticipated formation area 310', the SOI layer 308 over the anticipated formation area 310' is reacted through the annealing treatment to form silicide, and then the first electrode 310a is formed at the area 310'. It is to be noted that a resistivity of 10 Ω/μm or lower, for instance, can be achieved at the first electrode 310a thus formed. In addition, in the embodiment, the metal film 332 is constituted of a metal that forms a metal silicide by reacting with the SOI layer 308 and may be formed through, for instance, sputtering. The thickness of the metal film 332 may be set at, for instance, 10 nm~30 nm.

Figure 5C:
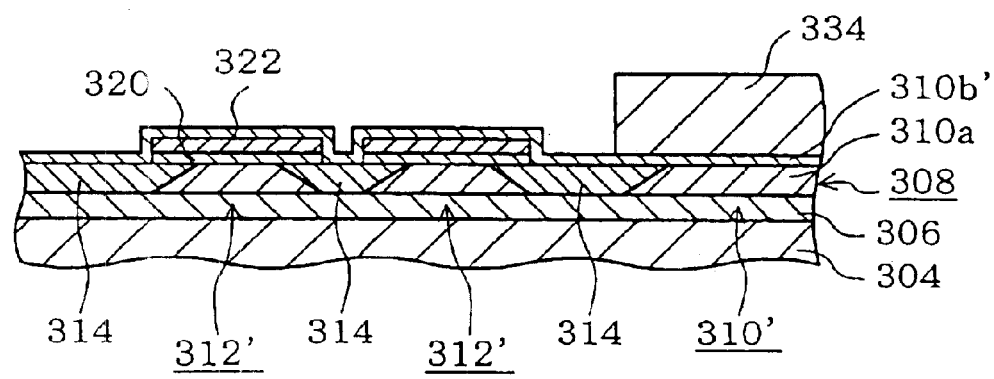

In step S53, the metal film 332 is removed, a base film 310b' to constitute the dielectric film 310b is formed over the entire wafer surface and then a photoresist 334 is formed on the base film 310b', as shown in FIG. 5(c). The metal film 332 may be removed through, for instance, wet etching using an ammonia hydrogen peroxide solution. In addition, the base film 310b', which may be a silicon oxide film, for instance, may be formed through the CVD method. Furthermore, the thickness of the base film 310b' may be set at, for instance, 10 nm~100 nm. The photoresist 334, which has a pattern that covers the anticipated formation area 310b' may be formed through photolithography.

Figure 5D:
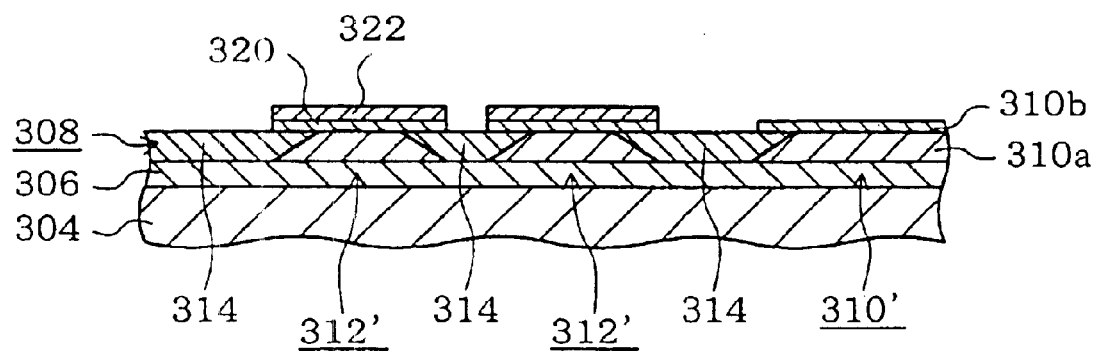

Next, in step S53, all the base film 310b' except for that on the anticipated formation area 310' is removed to form the dielectric film 310b and then the photoresist 334 is removed, as shown in FIG. 5(d). The base film 310b' may be removed through an etching process implemented by using the photoresist 334 as a mask.

It is to be noted that in FIG. 4 and FIGS. 5(a)~5(d), reference number 302 indicates an SOI wafer, reference number 304 indicates a substrate and reference number 306 indicates an insulating layer. Reference number 310c indicates a second electrode and reference number 312 indicates a transistor. In addition, reference number 312a indicates an active area, reference number 312b indicates a gate insulating film and reference number 312c indicates a gate electrode. Reference number 314 indicates an isolation region, with reference numbers 316 and 318 indicating side walls.

As explained above, the first electrode of the capacitor is formed within the SOI layer in the embodiment. Consequently, during the formation of the second electrode at the capacitor and the gate electrodes at the transistors, no stage is formed at the wafer surface. As a result, highly accurate patterning is achieved when forming the second electrode and the gate electrodes at the same time through photolithography and etching.

In addition, the capacitor in the embodiment is a PIM (polysilicon-insulator-metal) capacitor. Consequently, a capacitance that is different from the capacitances in the first and the second embodiments can easily be achieved in the capacitor in this embodiment. It goes without saying that the capacitance can be varied by constituting the first electrode with a different metal.

(Fourth Embodiment)

Figure 6A:
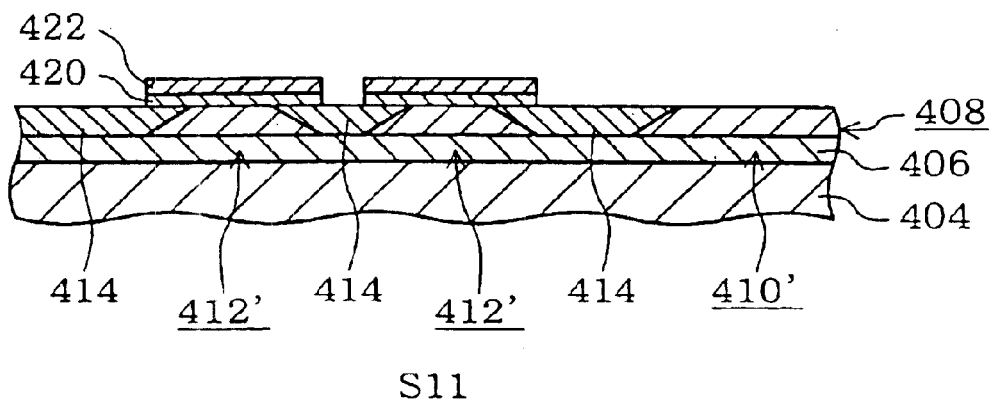
FIGS. 6(a)~6(g) illustrate steps in a method for manufacturing another semiconductor device that may employ the present invention.
Figure 6B:
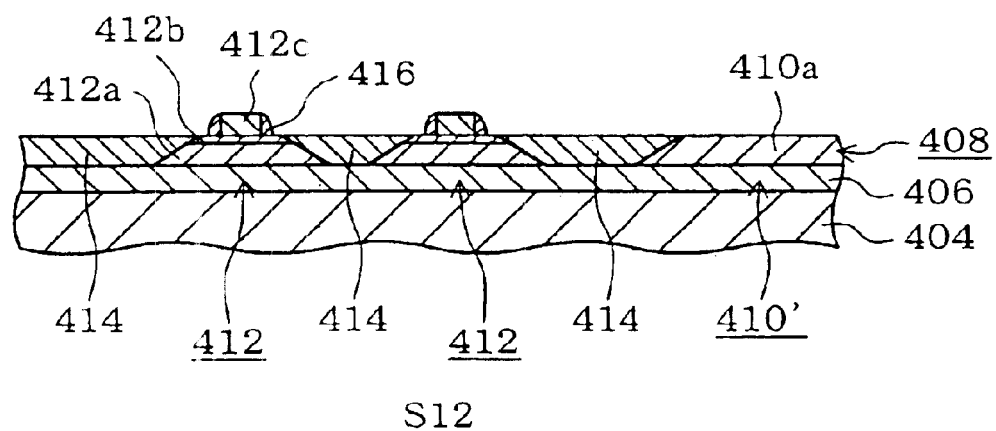
Figure 6C:
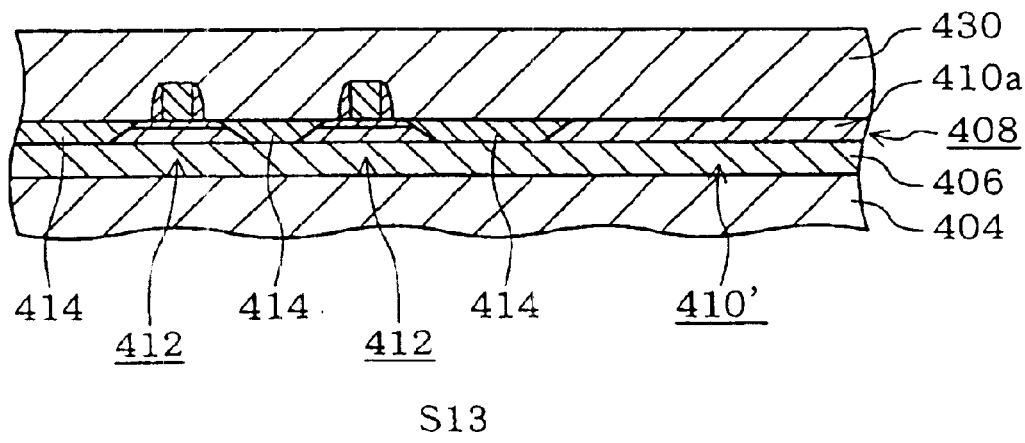
Figure 6D:
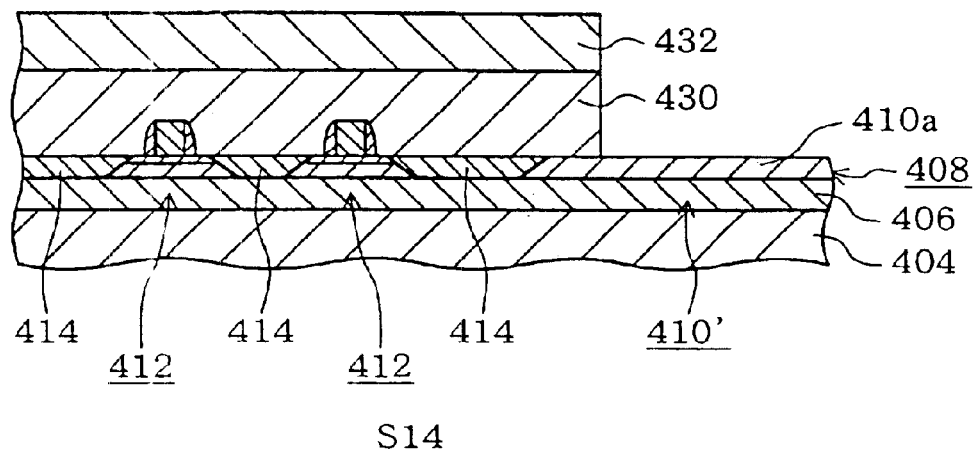
Figure 6E:
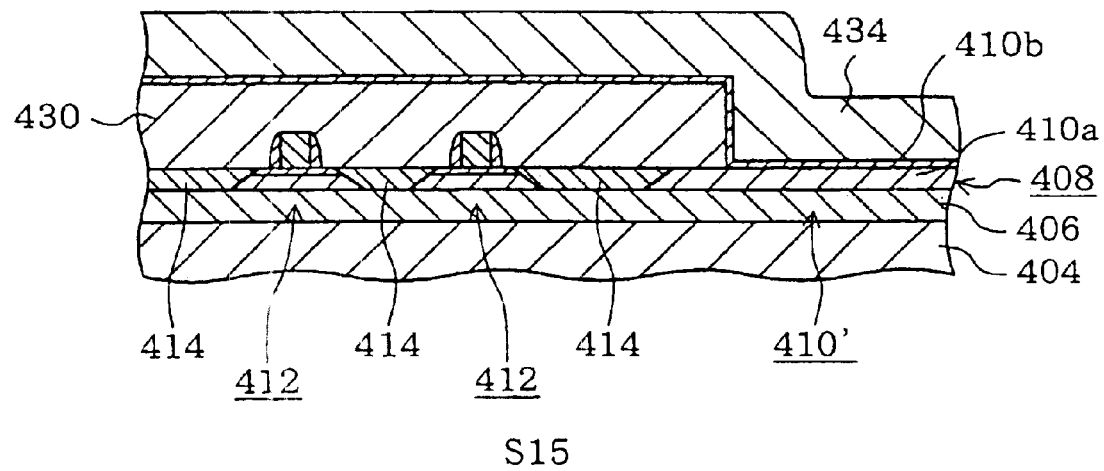
Figure 6F:
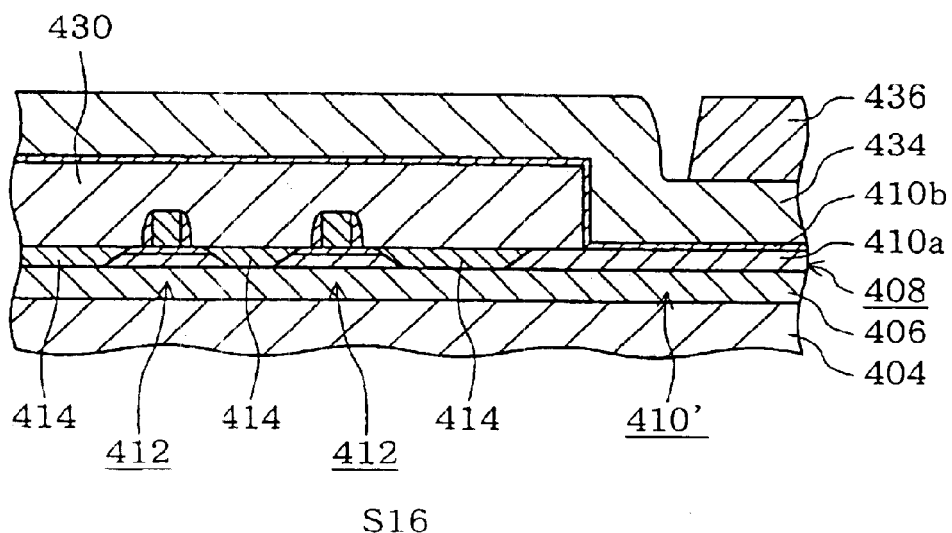
Figure 6G:
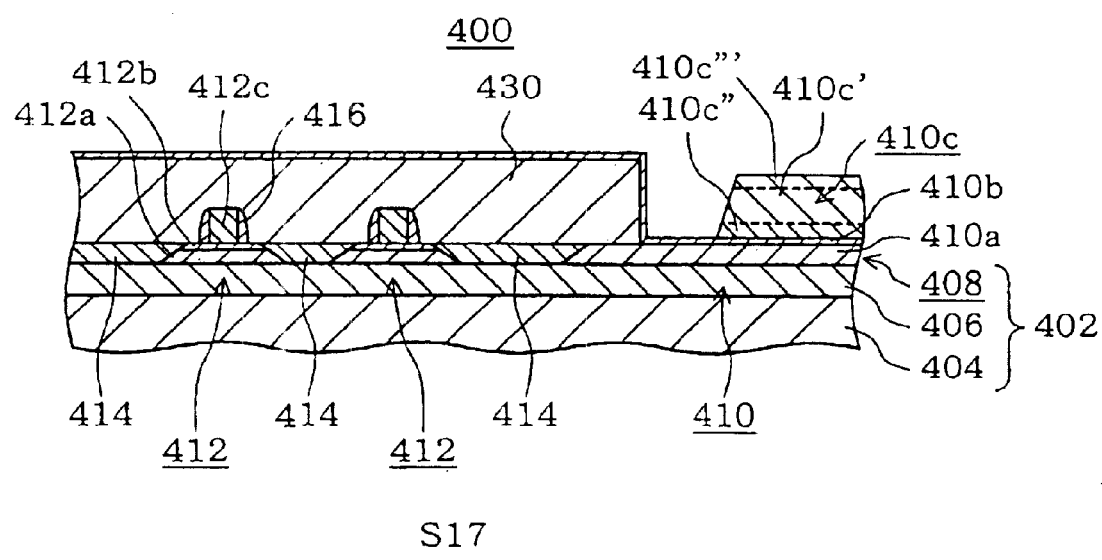

The fourth embodiment is explained in reference to FIGS. 6(a)~6(g). It is to be noted that FIGS. 6(a)~6(g) illustrate steps taken in a method for manufacturing a semiconductor device 400 according to the present invention. FIG. 6(g) also illustrates the essential structure of the semiconductor device 400.

As illustrated in FIG. 6(g), the semiconductor device 400 assumes an SOI structure and may be employed in, for instance, a RF (radio frequency) circuit, a HF (high frequency) circuit or an analog circuit. An SOI wafer 402 of the semiconductor device 400 comprises a substrate 404, an insulating layer 406 and an SOI layer 408. On the SOI wafer 402, one or a plurality of capacitors 410 and one or a plurality of transistors 412, at least, are mounted together. In the embodiment, the substrate 404 may be a silicon substrate, and the insulating layer 406 may be constituted of, for instance, a BOX layer.

Each capacitor 410 is provided with a first electrode 410a contained in the SOI layer 408, a dielectric film 410b formed on the SOI layer 408 and a second electrode 410c formed on the SOI layer 408. This capacitor 410 is a MOS (metal-oxide-semiconductor) type capacitor. In the embodiment, the first electrode 410a may be constituted of, for instance, silicon doped with a specific impurity, the dielectric film 410b may be constituted of, for instance, silicon oxide and a second electrode 410c is constituted by using a specific metal at its main constituent.

Each transistor 412 is provided with an active area 412a that is contained in the SOI layer 408, a gate insulating film 412b contained in the SOI layer 408 and a gate electrode 412c formed on the SOI layer 408. In the embodiment, the active area 412a may be constituted of, for instance, silicon doped with a specific impurity, the gate insulating film 412b may be constituted of, for instance, silicon oxide and the gate electrode 412c may be constituted of, for instance, polysilicon doped with a specific impurity.

In addition, the semiconductor device 400 is provided with isolation regions 414 contained in the SOI layer 408.

The isolation regions 414 each electrically isolate, at least, a first electrode 410a from the area contained in the SOI layer 408 excluding the first electrode 410a. The area excluding the first electrode 410a contained in the SOI layer 408 includes active areas 412a and another first electrode 410a. It is to be noted that in the embodiment, the isolation regions 414 may assume a structure which achieves electrical isolation for each of the active areas 412a from the area excluding the active areas 412a contained in the SOI layer 408.

In the embodiment, the isolation regions 414 may be constituted of, for instance, a field oxide film. Such isolation regions 414 may be formed through, for instance, the LOCOS method.

An addition, a layer insulating film 430 is included in the essential structure of the semiconductor device 400. This layer insulating film 430 prevents the SOI layer 408 from coming into direct contact with the layer formed on the layer insulating film 430 to electrically isolate the two layers from each other in a semiconductor device 400 adopting a multilayer structure. In the embodiment, the layer insulating film 430, which has a pattern opening on the capacitor 410, may be formed through the CVD method, for instance. The layer insulating film 430 may be constituted of, for instance, silicon oxide.

It is to be noted that in FIG. 6(g), reference number 416 indicates a side wall. The side walls 416 are used as spacers when achieving an LDD structure at the transistors 412. In the semiconductor device 400, the side walls 416 may be constituted of, for instance, silicon oxide.

In a method for manufacturing the semiconductor 400 described above, steps that are essentially identical to steps S1~S4 illustrated in FIGS. 1(a)~1(d) are implemented first. In the method for manufacturing the semiconductor device 400, steps S11~S17 illustrated in FIGS. 6(a)~6(g) are next implemented sequentially in this order.

As shown in FIG. 6(a), in step S11, first, a pad film 420 and an oxidation-preventing film 422 on an anticipated formation area 410' where the capacitor 410 is to be formed are removed and then the first electrode 410a is formed at the SOI layer 408 at the anticipated formation area 410'. The first electrode 410a may be formed by, for instance, introducing a specific impurity, to achieve the required conductivity in the SOI layer 408 at the anticipated formation area 410'. It is to be noted that in the method for manufacturing the semiconductor device 400, the dielectric film 410b shown in FIG. 6(f) is not yet formed in step S11.

As illustrated in FIG. 6(b), in step S12, first, the pad film 420 and the oxidation-preventing film 422 on the anticipated formation areas 412' are removed and then the transistors 412 and the side walls 416 are formed.

As shown in FIG. 6(c), in step S13, first, the layer insulating film 430 is formed to cover the entire wafer. The layer insulating film 430 in the embodiment may be constituted of silicon oxide and formed through, for instance, the CVD method. It is to be noted that the thickness of the layer insulating film 430 may be set at, for instance, 500 nm~700 nm.

In step S14, a photoresist 432 is first formed through photolithography and then the layer insulating film 430 is patterned through an etching process implemented by using the photoresist 432 as a mask, as shown in FIG. 6(d). The photoresist 432 used in this process has a pattern that opens on the anticipated formation area 410'.

As shown in FIG. 6(e), the photoresist 432 is first removed, the dielectric film 410b is formed over the entire wafer surface and then a metal layer 434 is formed over the dielectric film 410b in step S15. The dielectric film 410b may be constituted of a silicon oxide film and formed through, for instance, the CVD method. The thickness of the dielectric film 410b may be set at, for instance, 10 nm~100 nm. In addition, the metal layer 434 may assume a structure achieved by sequentially laminating a barrier metal, a main metal and an ARM (anti-reflection metal).

The presence of the barrier metal in the metal layer 434 prevents the main metal element from becoming diffused into the SOI layer 408, whereas the presence of the ARM prevents a reflection from occurring at the base of the photoresist film from during the photolithography exposure process. It is to be noted that the barrier metal and the ARM in the metal layer 434 may be constituted of a TiN film or another type of metal film having a thickness of, for instance, 10 nm~50 nm.

In addition, the main metal in the metal layer 434 may be an aluminum alloy. It is to be noted that when the main metal is constituted of an aluminum alloy film, the aluminum alloy film may be, for instance, an Al-0.5% Cu film.

Alternatively, the main metal in the metal layer 434 may be W (tungsten) or Cu (copper). When the main metal is constituted of W, the thickness of the W may be set at, for instance, 500 nm~1,000 nm.

As shown in FIG. 6(f), in step S16, first, a photoresist 436 is formed by using the mask provided for the formation of the second electrode 410a at the capacitor 410. The photoresist 436 has a pattern that covers the anticipated formation area 410' where the capacitor 410 is to be formed.

As shown in FIG. 6(g), in step S17, first, the second electrode 410c is formed and then the photoresist 436 is removed through washing. By etching the metal layer 434 using the photoresist 436 as an etching mask, the second electrode 410c is formed out of the metal layer 434. It is to be noted that in FIGS. 6(a)~6(g), reference number 410c' indicates the main metal in the metal layer 434, reference number 410c" indicates the barrier metal in the metal layer 434, and reference number 410c'" indicates the ARM in the metal layer 434.

As explained above, the first electrode of the capacitor is formed within the SOI layer in the embodiment. Consequently, during the formation of the second electrode at the capacitor and the gate electrodes at the transistors, no stage is formed at the wafer surface. As a result, highly accurate patterning is achieved when forming the second electrode and the gate electrodes at the same time through photolithography and etching.

In addition, while the second electrodes in the capacitors in the first through third embodiments are constituted of conductive polysilicon, the second electrode in the capacitor in the fourth embodiment is constituted of metal. Consequently, a capacitance that is different from the capacitance's in the first through third embodiments can easily be achieved in the capacitor in this embodiment.

It goes without saying that the capacitance can be varied by constituting the second electrode with a different metal. In addition, this embodiment may be employed in a semiconductor device having a first electrode constituted of a material selected from, for instance, conductive polysilicon, Co silicide, Ti silicide, Mo silicide and the like.

(Fifth Embodiment)

Figure 7A:
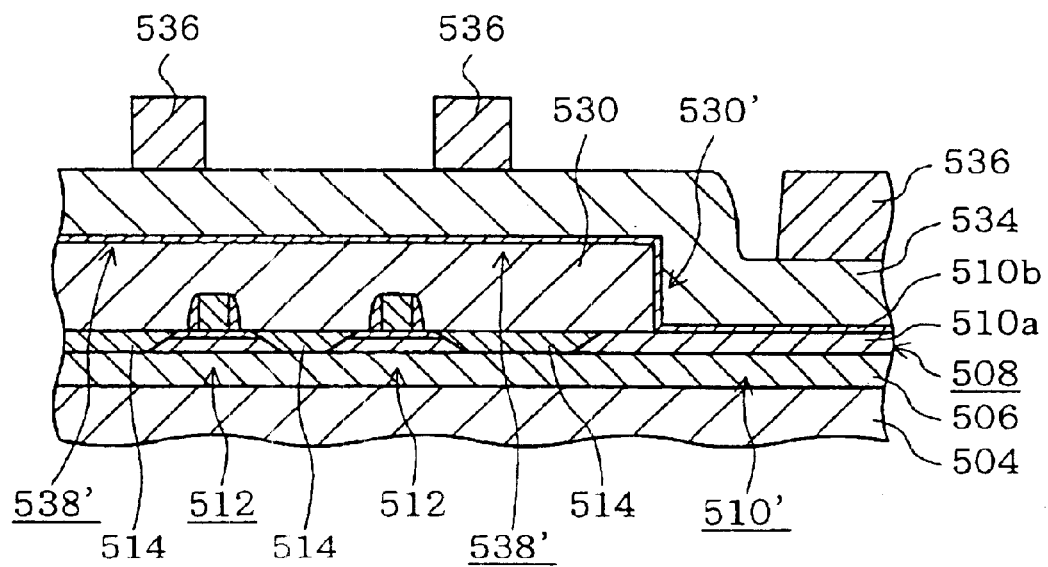
FIGS. 7(a) and 7(b) illustrate steps in a method for manufacturing yet another semiconductor device that may employ the present invention.
Figure 7B:
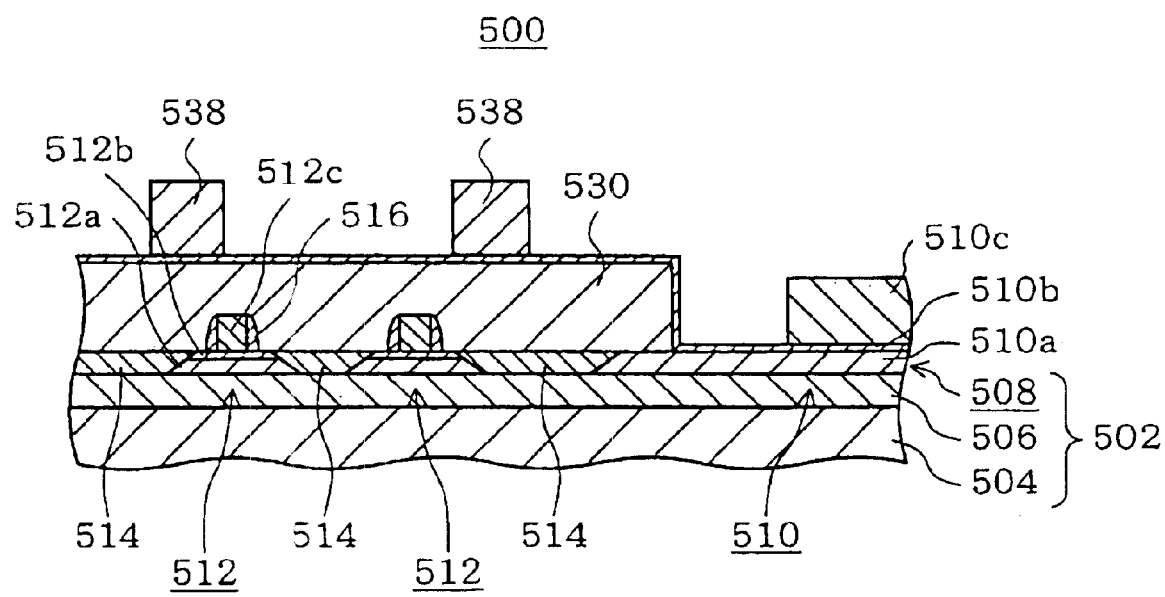

The fifth embodiment is explained in reference to FIGS. 7(a) and 7(b). It is to be noted that FIGS. 7(a) and 7(b) illustrate steps taken in a method for manufacturing a semiconductor device 500. FIG. 7(b) also illustrates the essential structure of the semiconductor device 500.

As shown in FIG. 7(b), the semiconductor device 500 differs from the semiconductor device 400 in the fourth embodiment illustrated in FIG. 6(g) in that it includes a wiring 538. Other structural features of the semiconductor 500 are essentially identical to those of the semiconductor device 400 illustrated in FIG. 6(g).

In the semiconductor device 500, the wiring 538 is a wiring for an electrical circuit (not shown) other than a capacitor 510 or any of transistors 512, that is formed at the semiconductor device 500. It is to be noted that such an electrical circuit that may be employed in the semiconductor device 500 may be, for instance, a memory circuit or a logic circuit.

In the semiconductor device 500, the wiring 538 is formed on a layer insulating film 530. In other words, the wiring 538 is formed on an SOI layer 508 via the layer insulating film 530.

The semiconductor device 500 in the embodiment can be manufactured through a manufacturing flow that is essentially identical to that implemented in the method for manufacturing the semiconductor device 400 illustrated in FIGS. 6(a)~6(g), by substantially modifying step S16 in FIG. 6(f). Hereafter, the modified step S16 is to be referred to as step S165.

As shown in FIG. 7(a), in step S165, a photoresist 536 is formed on the wafer. The photoresist 536 has a pattern that covers an anticipated formation area 510' where the capacitor 510 is to be formed and anticipated formation areas 538' where the wiring 538 is to be formed.

It is to be noted that the photoresist 536 is formed over the anticipated formation area 510'and the anticipated formation areas 538' having different surface heights. In other words, at the base of the photoresist 536, a stage 530' attributable to the presence of the layer insulating film 530 exists. However, since the area occupied by the capacitor is relatively large in a standard semiconductor device (e.g., in the 10 μm~100 μm order), the processing accuracy required for the capacitor is not as high as the processing accuracy required in the formation of the gate electrodes. Likewise, the processing accuracy required for the wiring pattern excluding the gate electrodes is not as high as the accuracy required for the formation of the gate electrodes in a standard semiconductor device. Thus, the degradation in the processing accuracy at the photoresist 536 caused by the presence of the stage 530' does not present a significant problem in the method for manufacturing the semiconductor device 500.

As shown in FIG. 7(b), in the method for manufacturing the semiconductor device 500, a second electrode 510c and the wirings 538 are first formed and then the photoresist 536 is removed through washing in a step that is essentially identical to step S17 shown in FIG. 6(g). The second electrode 510c and the wirings 538 can be formed out of a metal layer 534 during this process by etching the metal layer 534 with the photoresist 536 used as an etching mask.

It is to be noted that in FIGS. 7(a) and 7(b), reference number 502 indicates an SOI wafer, reference number 504 indicates a substrate and reference number 506 indicates an insulating layer and reference number 510a indicates a first electrode of the capacitor 510 whereas reference number 510b indicates a dielectric film of the capacitor 510. In addition, reference number 512a indicates an active area at a transistor 512, reference number 512b indicates a gate insulating film at the transistor 512 and reference number 512c indicates a gate electrode of the transistor 512. Reference number 514 indicates an isolation region, with reference number 516 indicating a side wall.

As explained above, the first electrode of the capacitor is formed within the SOI layer in the embodiment. Consequently, during the formation of the second electrode at the capacitor and the gate electrodes at the transistors, no stage is formed at the wafer surface. As a result, highly accurate patterning is achieved when forming the second electrode and the gate electrodes at the same time through photolithography and etching.

In addition, While the second electrodes in the capacitors in the first through third embodiments are constituted of conductive polysilicon, the second electrode in the capacitor of the fourth embodiment is constituted of metal. Consequently, a capacitance that is different from the capacitances in the first through third embodiments can easily be achieved in the capacitor in this embodiment.

Furthermore, in the embodiment, the second electrode at the capacitor and the other wirings are formed through a single step. Thus, the embodiment achieves an improvement in the yield and a reduction in the initial cost by reducing the number of manufacturing steps with respect to the semiconductor device and the manufacturing method thereof.

It is to be noted that if the semiconductor device in the embodiment is a multilayer wiring device, the wirings that are formed concurrently during the formation of the second electrode at the capacitor do not need to be the first layer wiring. Namely, in the embodiment, wirings in the second layer, the third layer or the nth layer (n is an arbitrary positive integer) can be formed concurrently during the formation of the second electrode of the capacitor, as long as it does not present any new problems in processing.

(Sixth Embodiment)

Figure 8A:
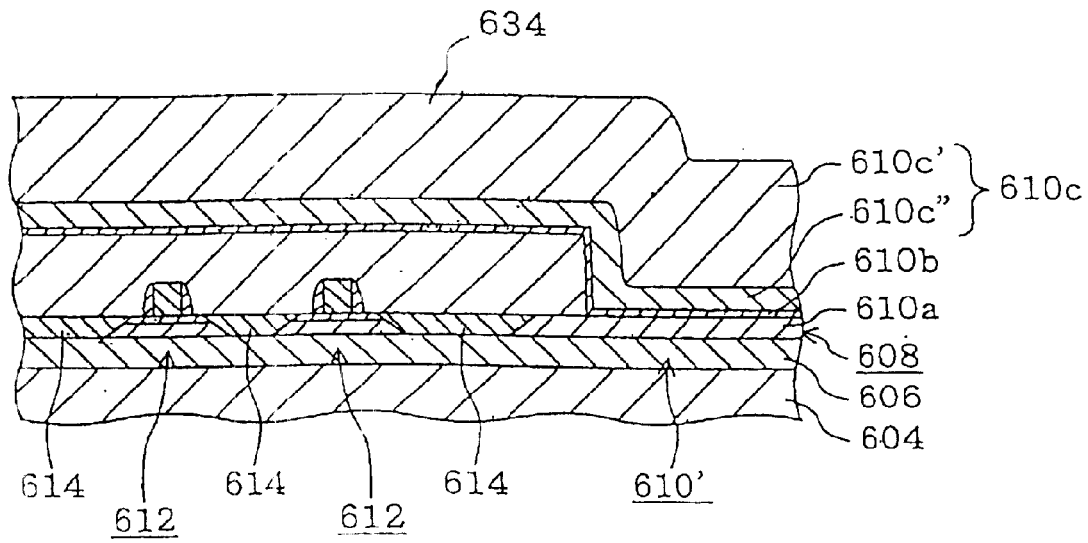
FIGS. 8(a) and 8(b) illustrate steps in a method for manufacturing yet another semiconductor device that may employ the present invention.
Figure 8B:
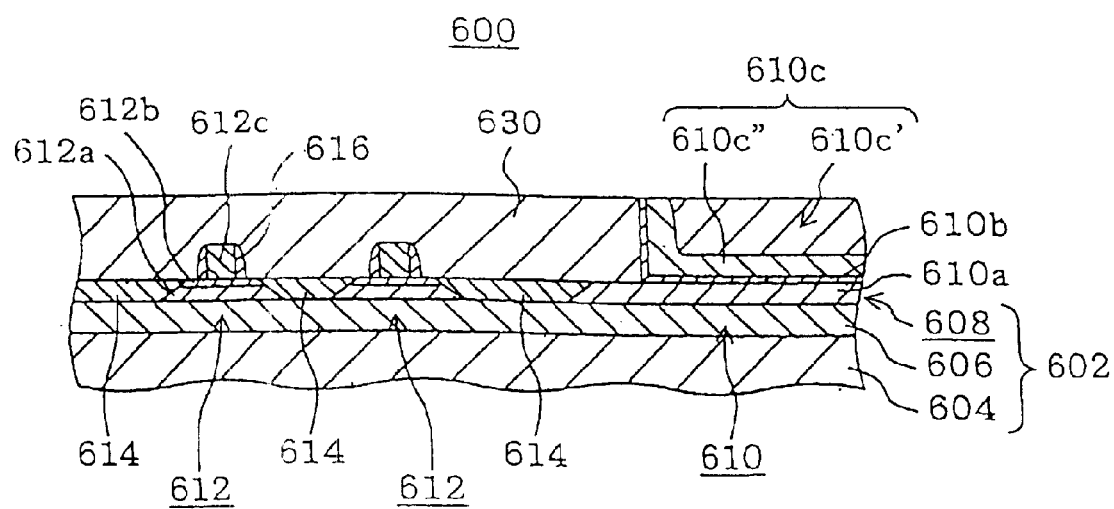

The sixth embodiment is explained in reference to FIGS. 8(a) and 8(b). It is to be noted that FIGS. 8(a) and 8(b) illustrate steps taken in a method for manufacturing a semiconductor device 600. FIG. 8(b) also illustrates the essential structure of the semiconductor device 600.

As shown in FIG. 8(b), the semiconductor device 600 differs from the semiconductor device 400 in the fourth embodiment shown in FIG. 6(g) in that the second electrode at the capacitor is formed through a different method. Other structural features of the semiconductor device 600 are identical to those of the semiconductor device 400 in FIG. 6(g).

In the method for manufacturing the semiconductor device 600 explained below, first, steps that are essentially identical to steps S1~S4 illustrated in FIGS. 1(a)~1(d) are implemented and then steps that are essentially identical to steps S11~S15 illustrated in FIGS. 6(a)~6(e) are implemented. In this case, the metal layer 610c in FIG. 8a includes barrier metal 610c" and main metal layer 610c', as similar to FIG. 6c. As a result, a wafer is formed in a state illustrated in FIG. 8(a).

As illustrated in FIG. 8(b), in the method for manufacturing the semiconductor device 600, the wafer surface shown in FIG. 8(a) is next polished through CMP and a second electrode 610c of a capacitor 610 is formed. In the CMP method, a metal layer 634 formed on a layer insulating film 630 is removed through polishing and the metal layer 634 is left unremoved on the opening area of the pattern of the layer insulating film 630. As a result, the second electrode 610c is formed out of the metal layer 634 remaining at the opening portion of the pattern of the layer insulating film 630. It is to be noted that in this embodiment, the main metal 610c' of the metal layer 634 may be an aluminum alloy, W, Cu or the like, at in the fourth and fifth embodiments.

It is to be noted that in FIGS. 8(a) and 8(b), reference number 602 indicates an SOI wafer, reference number 604 indicates a substrate, reference number 606 indicates an insulating layer and reference number 608 indicates an SOI layer. Reference number 610a indicates a first electrode of the capacitor 610, whereas reference number 610b indicates a dielectric film of the capacitor 610. In addition, reference number 612 indicates a transistor, reference number 612a indicates an active area at the transistor 612, reference number 612b indicates a gate insulating film at the transistor 612 and reference number 612c indicates a gate electrode of the transistor 612. Reference number 614 indicates an isolation region, with reference number 616 indicating a side wall. Reference number 610' indicates an anticipated formation area where the capacitor 610 is to be formed.

As explained above, the first electrode of the capacitor is formed within the SOI layer in the embodiment. Consequently, during the formation of the second electrode at the capacitor and the gate electrodes at the transistors, no stage is formed at the wafer surface. As a result, highly accurate patterning is achieved when forming the second electrode and the gate electrodes at the same time through photolithography and etching.

In addition, in the embodiment, the second electrode of the capacitor is formed through CMP by utilizing the layer insulating film opening at the anticipated formation area where the capacitor is to be formed. In other words, it is not necessary to form the second electrode through photolithography and etching in this embodiment.

It is to be noted that if the area occupied by the second electrode at the capacitor is large, a dishing phenomenon may occur during the CMP treatment in this embodiment. If the dishing phenomenon occurs, the metal layer will be over-polished to result in a second electrode having an excessively small thickness. Thus, in this embodiment, pillars should be ideally formed on the wafer before it undergoes the CMP treatment. It is to be noted that the pillars in this context refer to a pillar-like pattern provided to prevent over-polishing from occurring during the CMP treatment. Pillars constituted of the layer insulating film may be formed over appropriate intervals at the anticipated formation area where the capacitor is to be formed while patterning the layer insulating film, for instance, in the embodiment. Even when such pillars are formed, the degree to which their presence affects the capacitor characteristics is small enough to be disregarded in the embodiment.

(Seventh Embodiment)

Figure 9A:
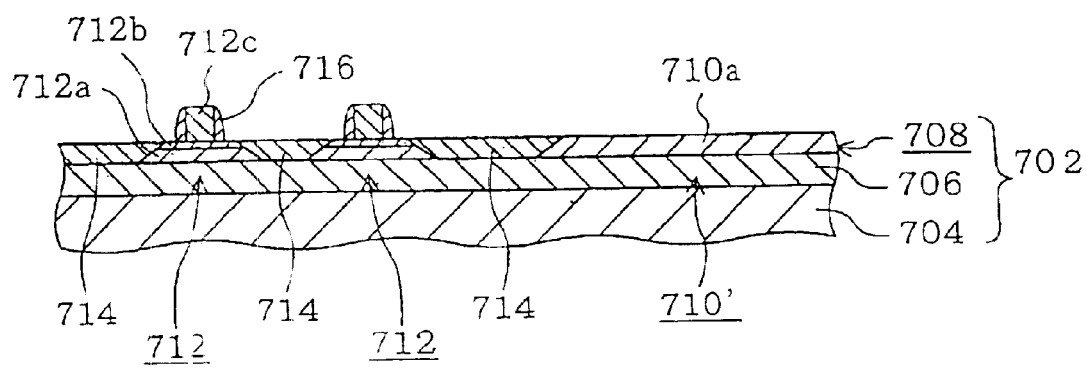
FIGS. 9(a) and 9(b) illustrate steps in a method for manufacturing yet another semiconductor device that may employ the present invention.
Figure 9B:
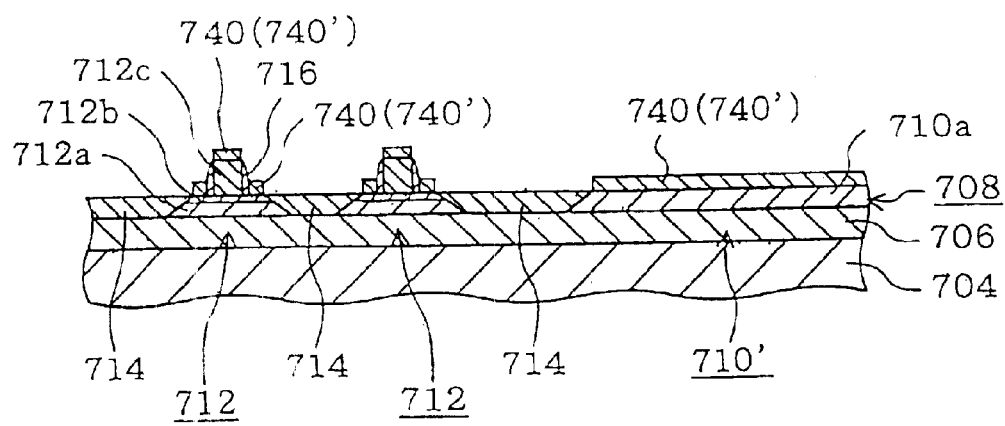
Figure 10A:
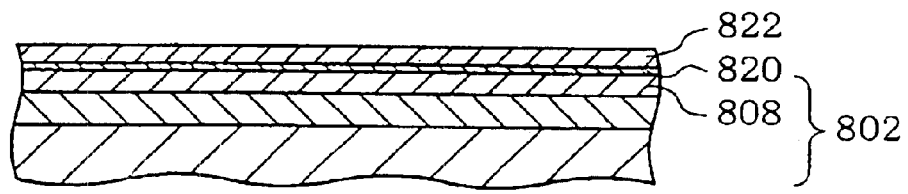
FIGS. 10(a)~10(g) illustrate steps taken in a method for manufacturing a semiconductor device in the prior art.
Figure 10B:
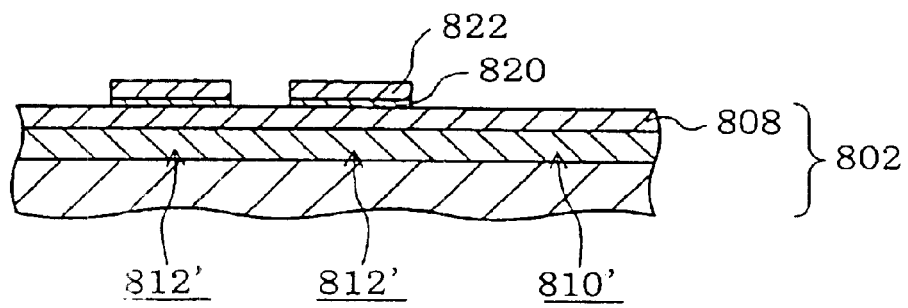
Figure 10C:
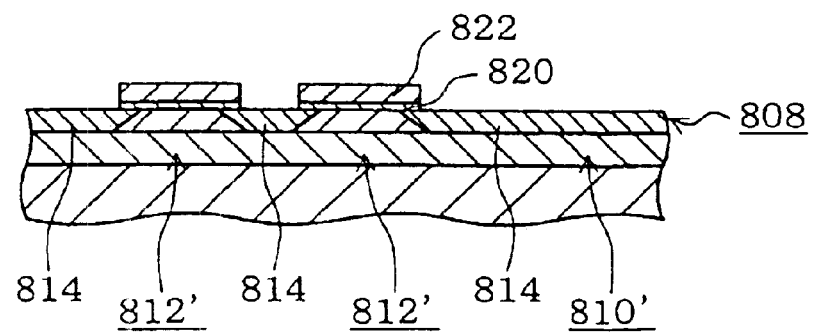
Figure 10D:
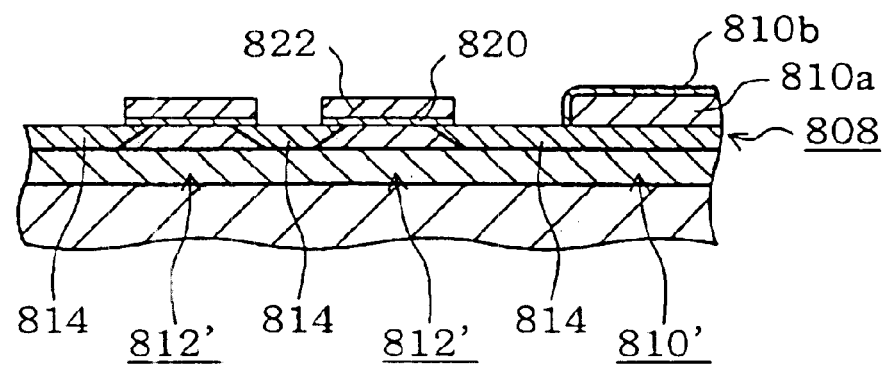
Figure 10E:
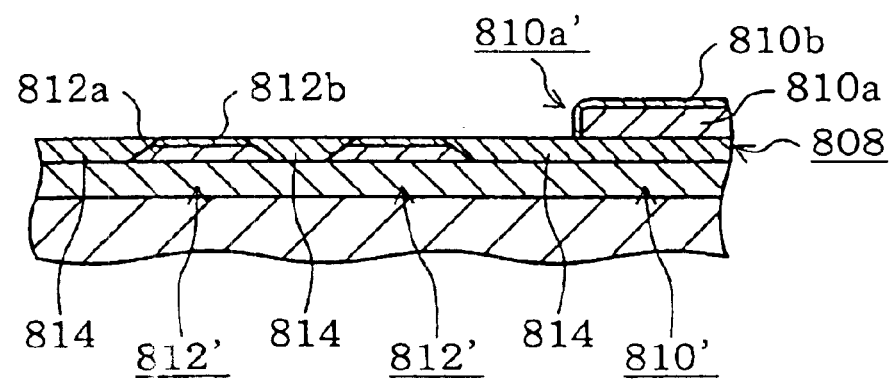
Figure 10F:
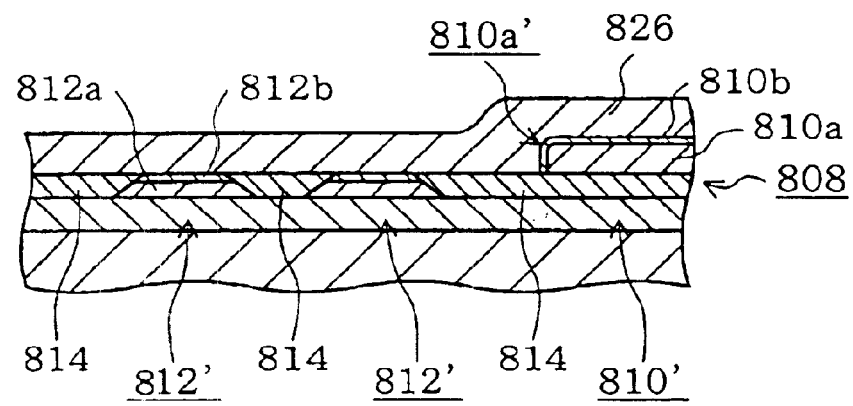
Figure 10G:
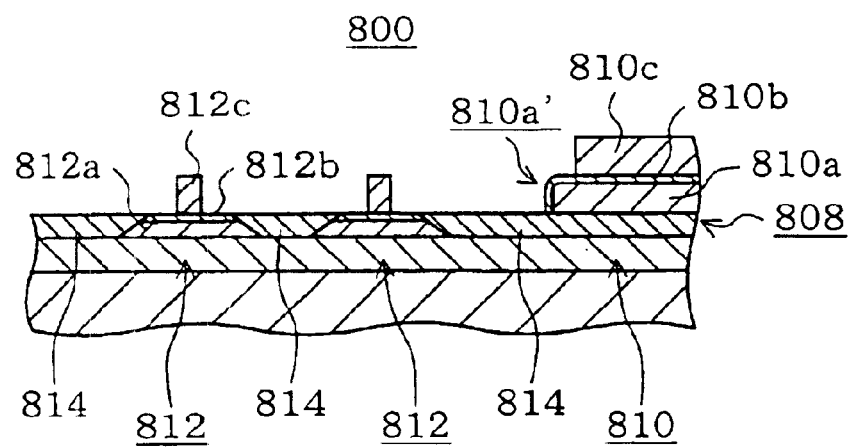

The seventh embodiment is explained in reference to FIGS. 9(a) and 9(b). It is to be noted that FIGS. 9(a) and 9(b) illustrate steps taken in a method for manufacturing a semiconductor device 700. FIG. 9(b) also illustrates the essential structure of the semiconductor device 700.

As shown in FIG. 9(b), the semiconductor device 700 differs from the semiconductor device 400 in the fourth embodiment shown in FIG. 6(g) in that it is provided with a metal silicide blocks. Other structural features of the semiconductor device 700 are essentially identical to those of the semiconductor device 400 in FIG. 6(g).

In the semiconductor device 700, metal silicide blocks 740 are formed on an SOI layer 708 above a first electrode 710a of a capacitor 710 and above active areas 712a of transistors 712 beside side walls 716. Metal silicide blocks 740 are also formed on gate electrode 712c of the transistors 712.

The semiconductor device 700 assuming the structure described above may be manufactured through a manufacturing flow that is essentially identical to the flow adopted in the method for manufacturing the semiconductor device 400 illustrated in FIGS. 6(a)~6(g), by adding step S20, which is to be explained below. It is to be noted that step S20 is added between step S12 shown in FIG. 6(b) and step S13 shown in FIG. 6(c).

In the method for manufacturing the semiconductor device 700, when a step that is essentially identical to step S12 in FIG. 6(b) is completed, the wafer achieves a state illustrated in FIG. 9(a). As shown in FIG. 9(b), in step S20, first, silicon blocks 740' are formed on the wafer illustrated in FIG. 9(a), and then metal silicide blocks 740 are formed by reacting the silicon blocks 740' to form silicide.

In step S20, the silicon blocks 740' are formed on the wafer in areas where silicon or polysilicon is exposed. In other words, the silicon blocks 740' are formed over the gate electrodes 712c of the transistor 712, over the active areas 712a exposed at sides of the side walls 716 and over the first electrode 710a at the anticipated formation area 710'. Such silicon blocks 740' can be selectively grown through, for instance, silicon-selecting epitaxial technology.

In step S20, the silicon blocks 740' are reacted to form metal silicide blocks 740 to achieve lower resistance at the silicon blocks 740'.

It is to be noted that in FIGS. 9(a) and 9(b), reference number 702 indicates an SOI wafer, reference number 704 indicates a substrate and reference number 706 indicates an insulating layer. In addition, reference number 712b indicates a gate insulating film at a transistor 712 and reference number 714 indicates an isolation region.

As explained above, the first electrode of the capacitor is formed within the SOI layer in the embodiment. Consequently, during the formation of the second electrode at the capacitor and the gate electrodes at the transistors, no stage is formed at the wafer surface. As a result, highly accurate patterning is achieved when forming the second electrode and the gate electrodes at the same time through photolithography and etching.

In addition, the embodiment achieves the following advantage as well.

Namely, while the functions of a standard semiconductor device may be adversely affected by higher resistance in the active areas if the SOI layer becomes thinner (e.g., 50 nm or less) to support further miniaturization in the future, the increase in the resistance in the active areas can be minimized in the embodiment since the metal silicide blocks are formed over the active areas of the transistors.

It is to be noted that in a semiconductor device with a thin SOI layer, a structure similar to that adopted in the embodiment, which is achieved by selectively growing a metal such as tungsten over areas where silicon is exposed on the wafer, may be adopted instead. This structure can be realized easily by providing the metal instead of the silicon blocks and the metal silicide blocks in the semiconductor device and the manufacturing method thereof in the embodiment.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the semiconductor device in each of the embodiments explained earlier has isolation regions constituted of a field oxide film, the present invention is not limited to this structural example. The present invention may be employed in semiconductor devices having various other types of isolation regions. Namely, the present invention may be employed in, for instance, a semiconductor device having another type of insulating area to constitute the isolation region, a semiconductor device having a groove achieving element isolation formed in the SOI layer to constitute an isolation region or a semiconductor device having a pn junction for element isolation formed in the SOI layer.

While an example in which the isolation regions are formed through LOCOS in the method for manufacturing a semiconductor is used in the explanation of each of the embodiments above, the present invention is not restricted to this example. The present invention may be also employed in methods of manufacturing a semiconductor device in which isolation regions are formed through any of various other methods such as the STI method, dicing, impurity doping for forming pn junctions for element isolation and the like.

While the first electrode and the active areas are formed through separate steps in the embodiments explained above, the present invention is not restricted to this example. The present invention may be also employed in a method for manufacturing a semiconductor device in which the first electrode and the active areas are formed at the same time. It is to be noted that while the conductivities at the first electrode and in the active areas, the thicknesses of the first electrode and the active areas, the dose quantities at the first electrode, the areas and the like can be controlled independently of each other by forming the first electrode and the active areas through separate steps, the number of manufacturing steps is reduced by forming the first electrode and the active areas at the same time to achieve a reduction in production costs and an improvement in yield.

While the second electrode at the capacitor and the gate electrodes at the transistors are formed concurrently in the method for manufacturing the semiconductor device in each of the embodiments, the present invention is not restricted to this example, and it may be employed in a semiconductor manufacturing method in which the second electrode at the capacitor and the gate electrodes at the transistors are formed through separate steps. It is to be noted that while the conductivities at the second electrode and at the gate electrodes, the thicknesses of the second electrode and the gate electrodes and the like can be controlled independently of each other by forming the second electrode and the gate electrodes through separate steps, the number of manufacturing steps is reduced by forming the second electrode and the gate electrodes at the same time to achieve a reduction in production costs and an improvement in yield.

While an example in which the barrier metal at the ARM in the metal layer are each constituted of a TiN film in the semiconductor manufacturing method is used in the explanation of the embodiments, the present invention is not restricted to this example, and it may be employed in a semiconductor manufacturing method in which the semiconductor device is provided with a metal layer having a barrier metal and an ARM constituted of any of various other materials.

While a silicon oxide film is used to constitute the dielectric film in the semiconductor devices in the embodiments explained above, the present invention is not restricted to this example. The present invention may be employed in a semiconductor device having a dielectric film constituted of a film that achieves electrical insulation such as a silicon nitride film, as well.

While the explanation is given above in reference to the embodiments on an example in which the semiconductor device is provided with a full depletion type SOI layer, the present invention is not restricted to this example and may be employed in a semiconductor device provided with a partial depletion type SOI layer. It is to be noted that in a semiconductor device having a partial depletion type SOI layer, a capacitor structure completely identical to that achieved in the semiconductor devices in the individual embodiments can be realized by allowing the isolation regions to reach the insulating layer.

In addition, the present invention may be employed in semiconductor devices with various types of capacitors, including a PIS (polysilicon-insulator-semiconductor) capacitor, a PIP (polysilicon-insulator-polysilicon) capacitor, a MIS (metal-insulator-semiconductor) capacitor, an MIP (metal-insulator-polysilicon) capacitor and an MIM (metal-insulator-metal) capacitor.

As has been explained, according to the present invention, by forming the first electrode of the capacitor within the SOI layer, the semiconductor device can be processed with a higher degree of accuracy.

What is claimed is:

1. A method for manufacturing a semiconductor device having an SOI structure, comprising:
   forming a silicon layer on an insulating layer;
   forming an isolation region within said silicon layer;
   forming a first electrode within said silicon layer, said first electrode being electrically isolated from remaining areas of said silicon layer by said isolation region;
   forming a dielectric member on said first electrode; and
   forming a second electrode on said dielectric member opposite said first electrode,
   said first electrode, said dielectric member and said second electrode forming a capacitor,
   wherein said forming a first electrode comprises
       ion implanting an inert element into said silicon layer over an anticipated formation area of said capacitor to form polysilicon within said silicon layer, and
       ion implanting a specific impurity into said polysilicon, so that said first electrode is formed as having a desired conductivity.

2. A method for manufacturing a semiconductor device according to claim 1, wherein said forming an isolation region comprises a LOCOS method.

3. A method for manufacturing a semiconductor device according to claim 1, further comprising:
   forming a layer insulating film having a pattern that opens over an anticipated formation area of said capacitor, before said forming a second electrode,
   said forming a second electrode includes
       forming a metal layer that at least covers said anticipated formation area, and
       performing a photolithography process and etching on said metal layer at said anticipated formation area to form said second electrode.

4. A method for manufacturing a semiconductor device according to claim 1, further comprising:
   forming a layer insulating film having a pattern that opens over an anticipated formation area of said capacitor, before said forming a second electrode,
   said forming a second electrode includes
       forming a metal layer that at least covers said anticipated formation area, and
       performing CMP (chemical mechanical polishing) on said metal layer at said anticipated formation area to form said second electrode.

5. A method for manufacturing a semiconductor device according to claim 1, further comprising:
   forming a transistor having an active area within said silicon layer; and
   forming a silicon block on a layer surface of the semiconductor device above at least said active area, after said forming a first electrode.

6. A method for manufacturing a semiconductor device according to claim 1, further comprising:

forming a transistor having an active area within said silicon layer;

forming a silicon block on a layer surface of the semiconductor device above at least said active area; and transforming said silicon block into a silicide after said forming a first electrode.

7. A method of manufacturing a semiconductor device according to claim 1, wherein said dielectric member is formed within said silicon layer.

8. A method for manufacturing a semiconductor device having an SOI structure, comprising:

forming a silicon layer on an insulating layer;

forming an isolation region within said silicon layer;

forming a first electrode within said silicon layer, said first electrode being electrically isolated from remaining areas of said silicon layer by said isolation region;

forming a dielectric member on said first electrode; and forming a second electrode on said dielectric member opposite said first electrode, said first electrode, said dielectric member and said second electrode forming a capacitor, wherein said forming a first electrode comprises forming a metal film on said silicon layer over an anticipated formation area of said capacitor, and transforming said silicon layer under said metal film into a silicide by heat treatment to form said first electrode.

9. A method for manufacturing a semiconductor device according to claim 8, wherein said forming an isolation region comprises a LOGOS method.

10. A method of manufacturing a semiconductor device according to claim 8, wherein said dielectric member is formed on said silicon layer transformed into the silicide.

11. A method for manufacturing a semiconductor device having an SOI structure, comprising:

forming a silicon layer on an insulating layer;

forming an isolation region within said silicon layer;

forming a first electrode within said silicon layer, said first electrode being electrically isolated from remaining areas of said silicon layer by said isolation region;

forming a dielectric member on said first electrode;

forming a second electrode on said dielectric member opposite said first electrode, said first electrode, said dielectric member and said second electrode forming a capacitor; and forming a layer insulating film having a pattern that opens over an anticipated formation area of said capacitor, before said forming a second electrode, said forming a second electrode includes forming a metal layer that at least covers said anticipated formation area and a specific portion of said layer insulating film, and performing a photolithography process and etching on said metal layer at said anticipated formation area to form said second electrode, and at said specific portion to form a wiring.

12. A method for manufacturing a semiconductor device according to claim 11, wherein said forming a first electrode comprises ion implanting a specific impurity into said silicon layer over an anticipated formation area of said capacitor, so that said first electrode is formed as having a desired conductivity.

13. A method for manufacturing a semiconductor device according to claim 11, wherein said forming a first electrode comprises:

ion implanting an inert element into said silicon layer over an anticipated formation area of said capacitor to form polysilicon within said silicon layer; and ion implanting a specific impurity into said polysilicon, so that said first electrode is formed as having a desired conductivity.

14. A method for manufacturing a semiconductor device according to claim 11, wherein said forming an isolation region comprises a LOGOS method.

15. A method of manufacturing a semiconductor device according to claim 11, further comprising forming a dielectric layer on said layer insulating film and said anticipated formation area, before said forming a second electrode.

16. A method of manufacturing a semiconductor device having an SOI structure, comprising:

forming a silicon layer on an insulating layer;

forming an isolation region within said silicon layer;

forming a first electrode within said silicon layer, said first electrode being electrically isolated from remaining areas of said silicon layer by said isolation region;

forming a dielectric member on said first electrode;

forming a second electrode on said dielectric member opposite said first electrode, said first electrode, said dielectric member and said second electrode forming a capacitor, wherein said forming a dielectric member comprises oxidizing said first electrode;

forming an active area of a transistor within said silicon layer, said active area being isolated from said first electrode by said isolation region; and oxidizing said active area of said transistor to form a gate insulation layer, said dielectric member being further oxidized during said oxidizing of said active area.

17. A method for manufacturing a semiconductor device according to claim 16, wherein said forming an isolation region comprises a LOGOS method.

* * * * *